United States Patent
Yang et al.

(10) Patent No.: US 12,142,456 B2
(45) Date of Patent: Nov. 12, 2024

(54) SELF-DIFFERENTIAL CONFOCAL TILT SENSOR FOR MEASURING LEVEL VARIATION IN CHARGED PARTICLE BEAM SYSTEM

(71) Applicant: ASML Netherlands B.V., Veldhoven (NL)

(72) Inventors: Jinmei Yang, Beijing (CN); Jian Zhang, San Jose, CA (US); Zhiwen Kang, Milpitas, CA (US); Yixiang Wang, Fremont, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 346 days.

(21) Appl. No.: 17/638,777

(22) PCT Filed: Aug. 20, 2020

(86) PCT No.: PCT/EP2020/073443
§ 371 (c)(1),
(2) Date: Feb. 25, 2022

(87) PCT Pub. No.: WO2021/037695
PCT Pub. Date: Mar. 4, 2021

(65) Prior Publication Data
US 2022/0328283 A1 Oct. 13, 2022

(30) Foreign Application Priority Data
Aug. 30, 2019 (WO) ............... PCT/CN2019/103819

(51) Int. Cl.
*H01J 37/28* (2006.01)
*G01N 23/2251* (2018.01)
*H01J 37/26* (2006.01)

(52) U.S. Cl.
CPC .......... *H01J 37/28* (2013.01); *G01N 23/2251* (2013.01); *H01J 37/265* (2013.01);
(Continued)

(58) Field of Classification Search
CPC ........ H01J 37/28; H01J 37/265; H01J 37/226; H01J 2237/226; H01J 2237/2482;
(Continued)

(56) References Cited

U.S. PATENT DOCUMENTS

| 4,981,354 A | 1/1991 | DeHainaut et al. |
| 5,218,415 A * | 6/1993 | Kawashima ............... G03F 9/70 |
| | | 250/559.3 |

(Continued)

FOREIGN PATENT DOCUMENTS

| CN | 104296686 A | 1/2015 |
| CN | 108463869 A | 8/2018 |

(Continued)

OTHER PUBLICATIONS

Notice of Reasons for Rejection issued by the Japan Patent Office in related Japanese Patent Application No. 2022-509193; mailed Apr. 26, 2023 (7 pgs.).

(Continued)

*Primary Examiner* — David E Smith
(74) *Attorney, Agent, or Firm* — Finnegan, Henderson, Farabow, Garrett & Dunner, LLP

(57) ABSTRACT

A sensor may be used to measure a degree of tilt of a sample. The sensor may include an apparatus having a light source, first, second, and third optical elements, a lens, and an aperture. The first optical element may supply light from the light source toward the sample, and may supply light input into the first optical element from the sample toward the second optical element. The second optical element may supply light toward first and second sensing elements. An (Continued)

aperture may be arranged on a focal plane of the lens. A light beam incident on the first sensing element may be a reference beam.

15 Claims, 15 Drawing Sheets

(52) U.S. Cl.
CPC .............. *H01J 2237/20207* (2013.01); *H01J 2237/20292* (2013.01); *H01J 2237/2482* (2013.01)

(58) Field of Classification Search
CPC ............ H01J 2237/20292; H01J 2237/20207; G01N 23/2251
See application file for complete search history.

(56) References Cited

U.S. PATENT DOCUMENTS

| | | | | |
|---|---|---|---|---|
| 5,392,115 | A * | 2/1995 | Oshida | .................. G03F 9/7026 |
| | | | | 356/485 |
| 5,473,166 | A | 12/1995 | Imai et al. | |
| 8,928,891 | B2 * | 1/2015 | Van Amstel | ......... G01B 11/026 |
| | | | | 356/510 |
| 9,400,176 | B2 | 7/2016 | Wang et al. | |
| 2010/0225926 | A1 | 9/2010 | van Amstel et al. | |
| 2011/0260055 | A1 | 10/2011 | Wang et al. | |
| 2013/0200262 | A1 * | 8/2013 | Kruit | ..................... H01J 37/256 |
| | | | | 250/311 |

FOREIGN PATENT DOCUMENTS

| | | |
|---|---|---|
| DE | 202017100793 U1 * | 3/2017 |
| GB | 1206668 A | 9/1970 |
| JP | H01303721 A | 12/1989 |
| KR | 20010029131 A | 4/2021 |
| TW | 201626421 A | 7/2016 |
| WO | WO 2017/130363 A1 | 9/2018 |

OTHER PUBLICATIONS

International Search Report and Written Opinion issued by the International Searching Authority in related International Application No. PCT/EP2020/073443, mailed Oct. 29, 2020 (10 pgs.).

Office Action issued by the Intellectual Property Office (IPO) in related ROC (Taiwan) Patent Application No. 109128343, issued Feb. 26, 2021 (6 pgs.).

Office Action issued by the Intellectual Property Office (IPO) in related ROC (Taiwan) Patent Application No. 109128343, issued Nov. 10, 2021 (18 pgs.).

* cited by examiner

SELF-DIFFERENTIAL CONFOCAL TILT SENSOR FOR MEASURING LEVEL VARIATION IN CHARGED PARTICLE BEAM SYSTEM

CROSS-REFERENCE TO RELATED APPLICATIONS

This application claims priority to International Application No. PCT/EP2020/073443, filed Aug. 20, 2020, and published as WO 2021/037695 A1, which claims priority of Chinese PCT application PCT/CN2019/103819 which was filed on Aug. 30, 2019. The contents of these applications are incorporated herein by reference in their entireties.

FIELD

The description herein relates to sensors that may be useful in charged particle beam systems, and more particularly, to a self-differential confocal tilt sensor that may be used for measuring level variation of a sample, such as a cooperative target.

BACKGROUND

Charged particle beams may be useful in the field of semiconductor wafer processing. A charged particle beam apparatus may be used for processing a sample, such as a wafer. Processing may include forming patterns on a wafer or inspecting the wafer. In some situations, prior to processing a wafer, it should be ensured that the wafer is level.

Inspecting a wafer may involve studying the surface topography of the wafer. The surface topography, which may include contaminants, may affect the distribution of light scattered from the surface of the wafer. Optical scattering analysis may be useful in evaluating polished optical surfaces, bulk optical materials, surface residues, or diffuse scattering materials. Additionally, some inspection tools may measure the surface roughness of the wafer.

Inspecting a wafer may also involve detecting defects on the wafer. For example, to enhance the yield and reliability of semiconductor devices, such as integrated circuits (ICs) and memory devices, a wafer may be subject to defect inspection by irradiating the wafer with a charged particle beam. Defects, such as foreign particles, scratches, residuals, bridging defects, and the like, may be present on the wafer and may cause devices to fail electrically. Such defects may be detected by analyzing secondary or backscattered particles coming from the wafer having been irradiated by a charged particle beam. An example of a charged particle beam apparatus includes a scanning electron microscope (SEM).

With the continuing miniaturization of semiconductor devices, inspection systems using a charged particle beam apparatus may demand higher performance. For example, inspection systems may require higher sensitivity, accuracy, and the like.

In a charged particle beam system, a sample may be placed on a platform prior to processing. For example, a wafer to be inspected may be loaded into a load/lock system of a SEM. The wafer may be positioned on a wafer holder inside of a chamber. The wafer may be arranged in a specific position so that inspection or other processing may be carried out. For example, the wafer may be positioned so that its principal surface is perpendicular to an incident charged particle beam.

SUMMARY

Embodiments of the present disclosure provide systems and methods for sensing a beam. In some embodiments, there may be provided an apparatus including a light source configured to irradiate a sample, a first optical element configured to supply light from the light source in a first direction to the sample and to supply light input to the first optical element in a second direction to another component in a third direction, and a second optical element configured to supply light in a fourth direction to a first sensing element and to supply light to a third optical element in a fifth direction. The apparatus may include the third optical element, and the third optical element may be configured to supply light to a second sensing element. The apparatus may include a lens configured to focus light from the light source, and the lens may be arranged between the second optical element and an aperture. The apparatus may also include the aperture, and the aperture may be arranged between the third optical element and the second sensing element, and the aperture may be arranged at a focal plane of the lens.

There may also be provided an apparatus including a first beam splitter configured to transmit light toward a sample, and to reflect light toward a second beam splitter. The apparatus may include the second beam splitter, and the second beam splitter may be configured to transmit light along a first beam path and a second beam path. The apparatus may include an aperture arranged on the second beam path.

There may also be provided a method of sensing a beam of light. The method may include inputting light into a first optical element, inputting light from the first optical element into a second optical element, directing light from the second optical element along a first beam path toward a first sensing element, focusing light along a second beam path, and transmitting light through an aperture.

It is to be understood that both the foregoing general description and the following detailed description are exemplary and explanatory only and are not restrictive of the disclosed embodiments, as may be claimed.

BRIEF DESCRIPTION OF THE DRAWINGS

The above and other aspects of the present disclosure will become more apparent from the description of exemplary embodiments, taken in conjunction with the accompanying drawings.

DETAILED DESCRIPTION

Figure 1:
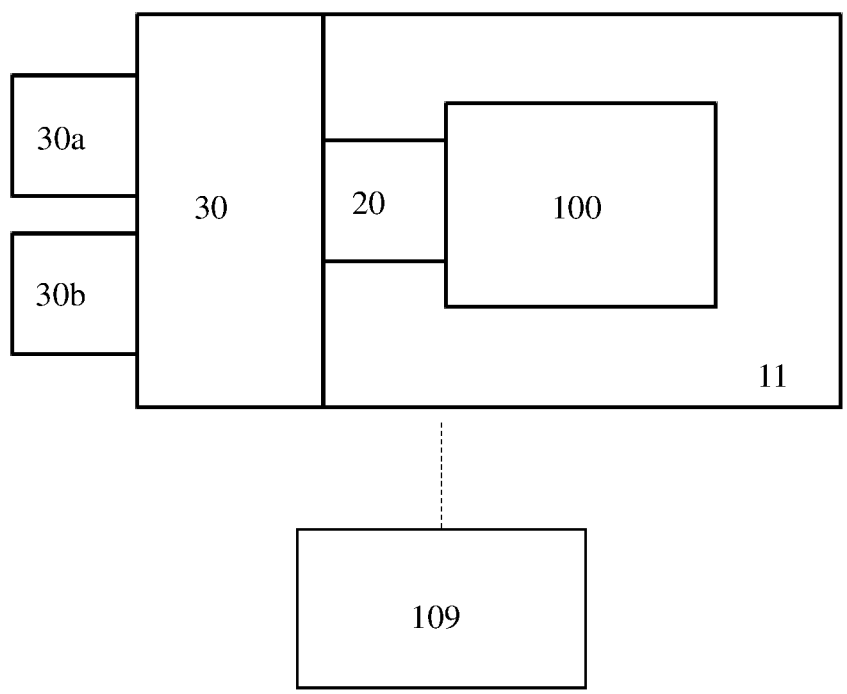
FIG. 1 is a schematic diagram illustrating an exemplary electron beam inspection (EBI) system, consistent with embodiments of the present disclosure.

Reference will now be made in detail to exemplary embodiments, examples of which are illustrated in the drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses, systems, and methods consistent with aspects related to subject matter that may be recited in the appended claims.

Electronic devices are constructed of circuits formed on a piece of silicon called a substrate. Many circuits may be formed together on the same piece of silicon and are called integrated circuits or ICs. With advancements in technology, the size of these circuits has decreased dramatically so that many more of them can fit on the substrate. For example, an IC chip in a smart phone can be as small as a thumbnail and yet may include over 2 billion transistors, the size of each transistor being less than 1/1,000th the size of a human hair.

Making these extremely small ICs is a complex, time-consuming, and expensive process, often involving hundreds of individual steps. Errors in even one step have the potential to result in defects in the finished IC, rendering it useless. Thus, one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection can be carried out using a scanning electron microscope (SEM). A SEM can be used to image these extremely small structures, in effect, taking a "picture" of the structures. The image can be used to determine if the structure was formed properly and also if it was formed in the proper location. If the structure is defective, then the process can be adjusted so the defect is less likely to recur.

Prior to imaging a sample, it may be useful to detect whether the sample is tilted, as the tilt may have an effect on the resulting image. For example, tilting may cause electrons reflected or generated from the sample to be directed to an unintended location. Rather than traveling to a detector, the electrons may be directed to location other than the detector and may go undetected. Also, tilting may cause the focus of a charged particle beam that is projected on the sample to degrade (for example, causing a focal point to be formed above the surface of the sample at some points, or below the surface of the sample at other points). Degraded focus may result in lower imaging resolution.

A tilt sensor may be provided so that tilt can be determined prior to sample imaging. For example, a SEM may have a tilt sensor that measures sample level variation and may issue an alert if the sample tilt angle is larger than a designated threshold. However, one problem of current systems is that the sensitivity of a tilt sensor may be insufficient, and it may be difficult to determine tilt angle sufficiently accurately when a sample is only slightly tilted, or if the sample has high surface roughness because, for example, a rough surface may cause electrons reflected from the sample to travel toward unintended locations. A rough surface may contain many irregularities, and electrons may reflect off these irregularities in unpredictable directions.

Surface roughness may refer to the texture of a surface of a sample. It may be quantified by the deviations of the surface from an ideal, perfectly flat plane. The higher the measure of surface roughness, the more textured and irregular the surface may be. As surface roughness increases, the compatibility of a sample with a tilt sensor may decrease. For example, it may be difficult for a tilt sensor to accurately and reliably detect the tilt angle of a sample having a very rough surface. In some situations, a cooperative target (e.g., a separate flat plate or other structure) may be provided that has a relatively smooth surface. The cooperative target may be mounted on the sample, which may have a relatively rough surface, or may be placed separated from and parallel to the sample. Thus, the cooperative target may form a smooth location that can act as the target. The tilt of the cooperative target may be used to measure the tilt of the sample rather than measuring the sample surface directly. Because a flat plate is attached or is parallel to the sample, its tilt corresponds to that of the sample, and so the flat plate can be said to "cooperate" with the sample. The cooperative target may be used instead of the sample itself as a target for projecting a light beam for determining a degree of tilt of the sample. In some cases, a cooperative target may be formed on a sample by selectively polishing a portion of the sample.

Furthermore, in some cases, the cooperative target may include a mask that is used to help form the sample. The sample may include a substrate (also called a "wafer") where IC components are formed. Forming a pattern to construct IC components on a wafer may be done through photolithography, which may involve shining light through a mask. The mask may be placed separated from the wafer and may be parallel to the wafer. In some cases, the mask may be formed directly on the wafer (e.g., a mask layer may be formed on the wafer that is later dissolved when the wafer is developed). A light-sensitive material on the wafer may react due to the exposure of light through the mask and structures may be formed on the wafer. Before exposure, the mask and the sample should be aligned. A step of detecting tilt of the wafer may be added in which the mask may be used as a cooperative target. Using the mask may be another example of indirectly measuring the tilt of the sample.

If sample tilt cannot be accurately measured, imaging quality may be adversely affected. As IC structures become smaller, it becomes increasingly important to provide more accurate and sensitive tilt sensors.

Providing a cooperative target may be one way of dealing with a sample having a rough surface. However, the steps involved in providing the cooperative target, e.g., separately preparing the cooperative target and mounting it on the sample (or placing it parallel to the sample), may incur increased effort and expense. For example, calibration may be required so that a tilt angle of the cooperative target corresponds with the sample. Furthermore, care must be taken to position the cooperative target at a location that does not interfere with sample imaging. As IC structures are packed closer together, there may be less space available to place a cooperative target. Additionally, throughput (e.g., the number of samples processed per hour) may suffer if separate steps are required to affix a cooperative target to each sample to be inspected. In some situations, it would be desirable for a tilt sensor to be configured to measure tilt of a variety of samples without requiring a cooperative target.

Some techniques may have been developed to deal with challenges in tilt sensing, but these may face certain issues of their own. For example, a tilt sensor having a single sensing element may have limitations in sensitivity and accuracy when detecting an amount of tilt as a single sensing element may be sensitive to source power variation and sample target reflectivity variation.

Also, a tilt sensor may include an aperture as part of the sensor structure, but the aperture may be relatively large. A large aperture may result in low sensitivity and may leak ambient light to a sensing element, as will be discussed in detail herein. This may have the effect of decreasing signal-to-noise ratio (SNR).

Furthermore, a tilt sensor may include a laser source used to project a beam on the sample. The laser source may have a limited lifetime. Thus, the laser source may degrade and dim with use over time. The laser source's output may also fluctuate randomly. Because the tilt sensor may measure tilt by detecting the intensity of a reflected laser beam, its accuracy may be affected by changes in the laser source due to age or other fluctuations. For example, a tilt sensor may falsely report that a wafer is tilted based on decreased detection signal, but such a decrease may be due to degradation of the laser source and not because the wafer is actually tilted.

Embodiments of the disclosure may address some issues of single sensing element sensors, such as single channel signal variation, or other issues. For example, a self-differential method may be used that may cancel source module power variation. A common mode beam may be added as a reference beam. An aperture may be used that is confocal with a source. Furthermore, modulation may be employed.

Use of a common mode as reference beam may compensate for degradation of a laser source. For example, even if the output of a laser source changes over time due to age or other reasons, such changes will be present in both the reference beam and the signal beam, and thus, the changes may cancel out. Accordingly, the useful lifetime of a tilt sensor may be extended. Furthermore, accuracy may be enhanced because random fluctuations in source output can be compensated for.

Use of an aperture and a confocal lens may allow for a much smaller size (e.g., diameter) aperture to be used. For example, a focused beam may pass through a small hole, while ambient light is substantially blocked and does not leak through. Use of a large hole, on the other hand, which may be required in a comparative example in order to secure enough sensitivity, may allow ambient light to leak through, and this may contribute to noise.

To enhance imaging performance, it may be desirable to maintain a sample (e.g., a wafer) to be level (e.g., not tilted) in a load/lock system of a charged particle beam system. For example, the charged particle beam system may include a detector configured to collect particles coming from the wafer having been irradiated by a charged particle beam. Emission of particles to be detected from the wafer may be influenced by the orientation of the wafer. If the wafer is tilted, emission angles of the particles may change depending on the degree of tilt of the wafer. Thus, it may be desirable to maintain the wafer in a level state. Furthermore, it may be desirable to measure the surface level variation of the wafer itself.

In some configurations, a wafer may be configured to have a predetermined degree of tilt relative to a reference plane. For example, a wafer may be configured to receive oblique incidence irradiation. In a variety of situations, it would be desirable to provide a sensor that can detect tilting of the wafer accurately.

Objects and advantages of the disclosure may be realized by the elements and combinations as set forth in the embodiments discussed herein. However, embodiments of the present disclosure are not necessarily required to achieve such exemplary objects or advantages, and some embodiments may not achieve any of the stated objects or advantages.

Without limiting the scope of the present disclosure, some embodiments may be described in the context of providing detectors and detection methods in systems utilizing electron beams. However, the disclosure is not so limited. Other types of charged particle beams may be similarly applied. Furthermore, systems and methods for detecting a tilt may be used in other imaging systems, such as optical imaging, photon detection, x-ray detection, ion detection, etc.

As used herein, unless specifically stated otherwise, the term "or" encompasses all possible combinations, except where infeasible. For example, if it is stated that a component includes A or B, then, unless specifically stated otherwise or infeasible, the component may include A, or B, or A and B. As a second example, if it is stated that a component includes A, B, or C, then, unless specifically stated otherwise or infeasible, the component may include A, or B, or C, or A and B, or A and C, or B and C, or A and B and C.

As used herein, the term "tilt" may refer to an inclination of a sample relative to a reference. The sample may be a wafer having a principal plane. For example, the wafer may have a shape similar to a thin plate that is substantially planar. The "tilt" of the wafer may refer to an angle that the principal plane of the wafer forms with a reference plane, or that a line perpendicular to the principal plane forms with a reference line, such as a line defined by an optical axis of a SEM (e.g., axis 105 of FIG. 8), at a point where the two lines intersect. The term "level variation" may refer to the tilt of a sample at different locations on the sample. For example, a surface of a sample may have a first tilt at a first location and a second tilt at a second location.

Reference is now made to FIG. 1, which illustrates an exemplary electron beam inspection (EBI) system 10 that may include a tilt sensor, consistent with embodiments of the present disclosure. EBI system 10 may be used for imaging. As shown in FIG. 1, EBI system 10 includes a main chamber 11 a load/lock chamber 20, an electron beam tool 100, and an equipment front end module (EFEM) 30. Electron beam tool 100 is located within main chamber 11. EFEM 30 includes a first loading port 30a and a second loading port 30b. EFEM 30 may include additional loading port(s). First loading port 30a and second loading port 30b receive wafer front opening unified pods (FOUPs) that contain wafers (e.g., semiconductor wafers or wafers made of other material(s)) or samples to be inspected (wafers and samples may be collectively referred to as "wafers" herein).

One or more robotic arms (not shown) in EFEM 30 may transport the wafers to load/lock chamber 20. Load/lock chamber 20 is connected to a load/lock vacuum pump system (not shown) which removes gas molecules in load/ lock chamber 20 to reach a first pressure below the atmospheric pressure. After reaching the first pressure, one or more robotic arms (not shown) may transport the wafer from load/lock chamber 20 to main chamber 11. Main chamber 11 is connected to a main chamber vacuum pump system (not shown) which removes gas molecules in main chamber 11 to reach a second pressure below the first pressure. After reaching the second pressure, the wafer is subject to inspection by electron beam tool 100. Electron beam tool 100 may be a single-beam system or a multi-beam system. A controller 109 is electronically connected to electron beam tool 100, and may be electronically connected to other components as well. Controller 109 may be a computer configured to execute various controls of EBI system 10. While controller 109 is shown in FIG. 1 as being outside of the structure that includes main chamber 11, load/lock chamber 20, and EFEM 30, it is appreciated that controller 109 can be part of the structure.

Figure 2A:
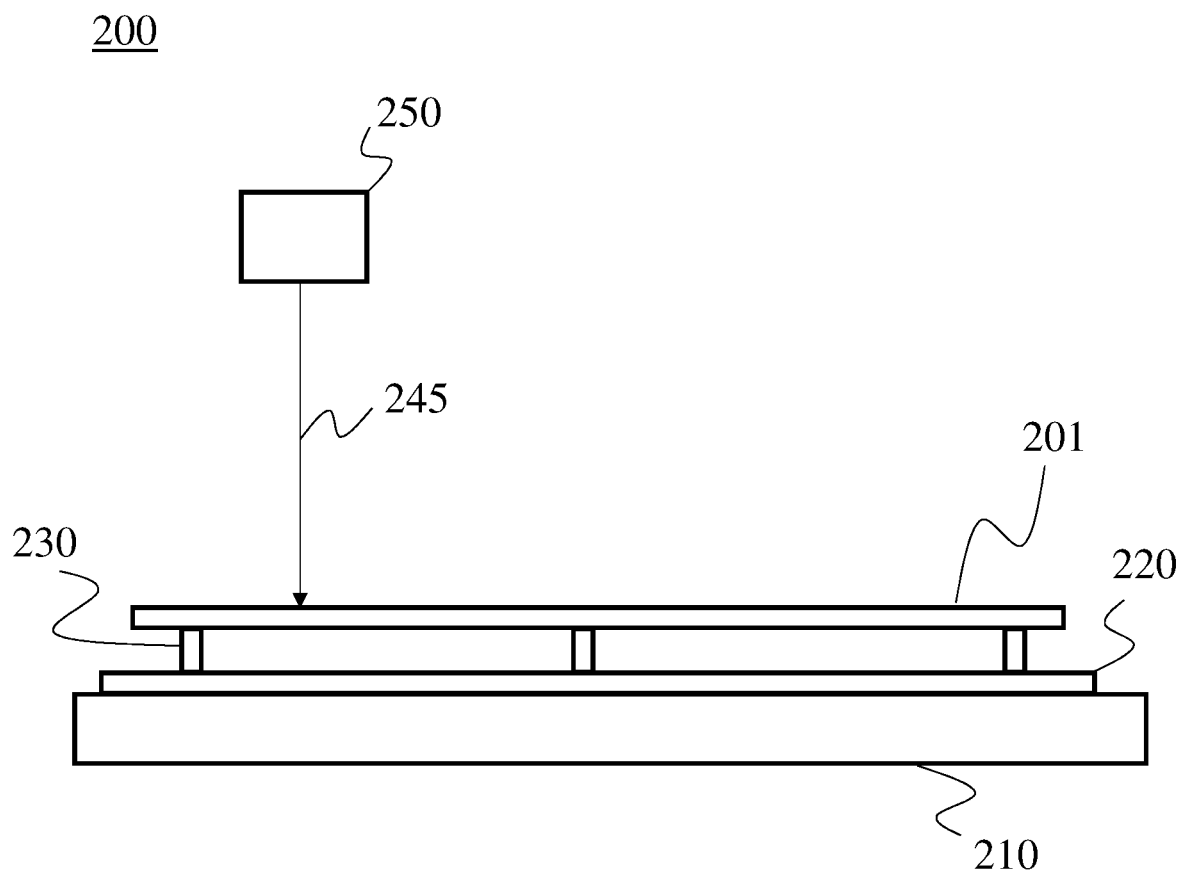
FIG. 2A is a schematic diagram of an exemplary load/lock apparatus, consistent with embodiments of the present disclosure that may be a part of the exemplary electron beam inspection system of FIG. 1.

FIG. 2A illustrates an exemplary arrangement of a load/lock apparatus 200 that may be included in load/lock chamber 20. Load/lock apparatus 200 may be provided for holding a wafer 201. Load/lock apparatus 200 may include a platform. Components of load/lock apparatus 200 may constitute a wafer holder. For example, as shown in FIG. 2A, load/lock apparatus 200 may include a bottom plate 220 disposed on a stage 210 with a wafer standoff 230 provided for holding wafer 201. Stage 210 may be movable. A plurality of wafer standoffs 230 may be provided. In some embodiments, three wafer standoffs may be provided such that there may be three holding points, thereby defining a plane.

There may also be provided a sensor 250. Sensor 250 may include a tilt sensor. Sensor 250 may be spaced apart from bottom plate 220. Sensor 250 may include an emitter for projecting a beam 245 toward wafer 201. Sensor 250 may include a receiver for receiving signals from wafer 201, such as a reflection of beam 245. Sensor 250 may be configured to project beam 245 directly (e.g., perpendicularly) toward wafer 201, or at an angle (see, e.g., FIG. 4).

Figure 2B:
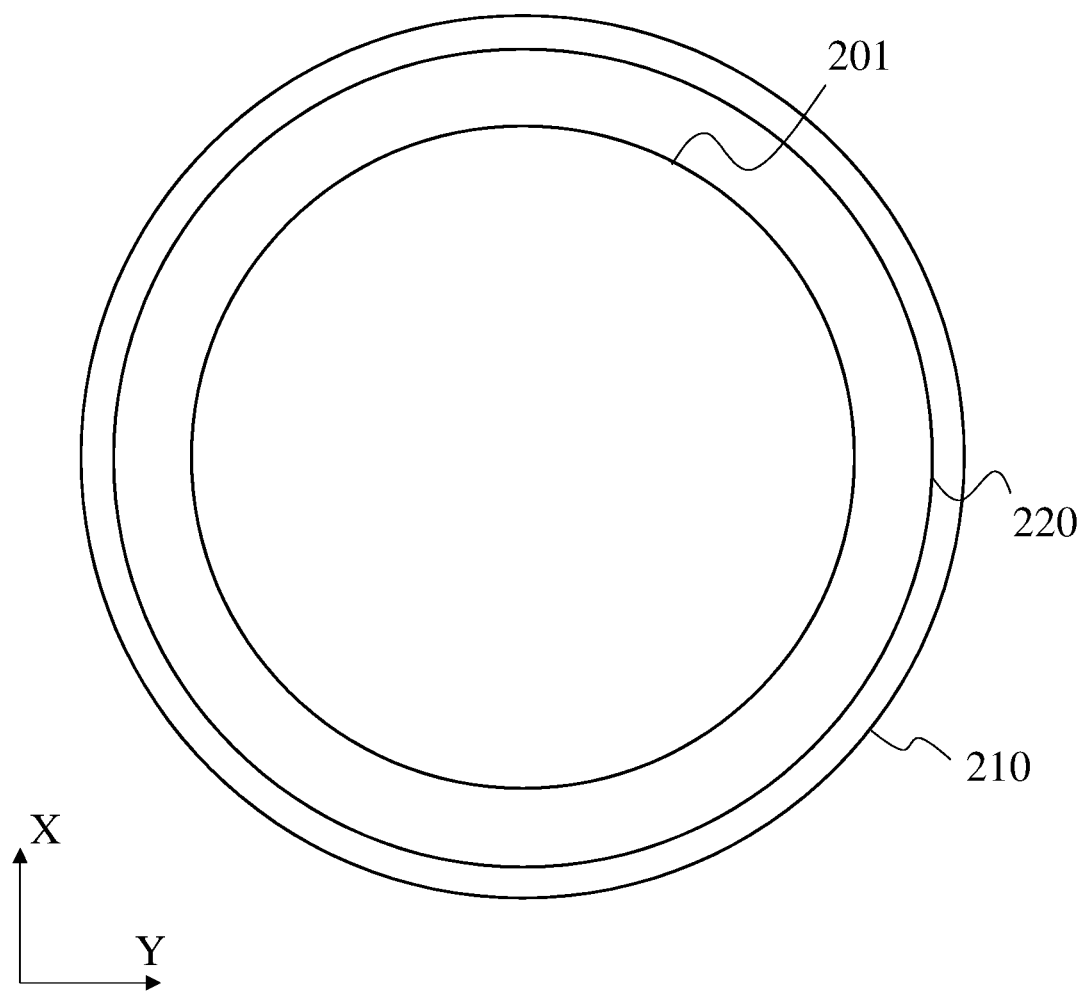
FIG. 2B is a plan view of a portion of the load/lock apparatus shown in FIG. 2B, consistent with embodiments of the present disclosure.

Sensor 250 may be configured to measure a property of a target. For example, a target may include wafer 201, as shown in FIG. 2A. Sensor 250 may be configured to measure a tilt of wafer 201. The tilt of wafer 201 may be relative to a reference plane. The reference plane may include a plane formed by the holding points of wafer standoffs 230. The reference plane may be parallel to a plane on which stage 210 is movable. For example, stage 210 may be movable in an X-Y plane, as shown in the plan view of FIG. 2B. The reference plane may be parallel to the X-Y plane. Stage 210 may be rotatable in the X-Y plane. Measuring a property of wafer 201 may involve rotating wafer 201 about an axis. Various locations on the surface of wafer 201 may be sensed by moving wafer 201.

Figure 3:
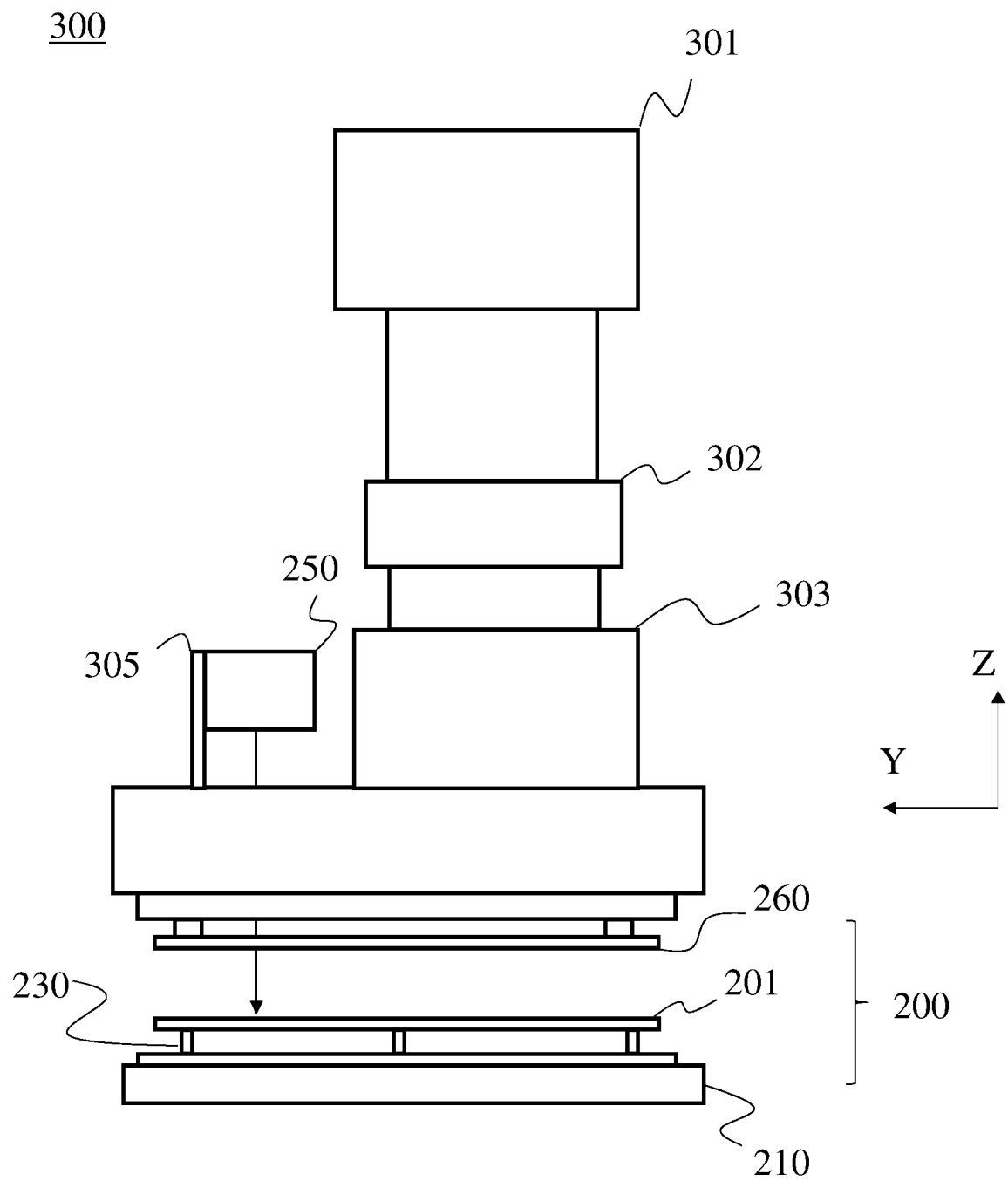
FIG. 3 is a view illustrating an exemplary load/lock system, consistent with embodiments of the present disclosure.

FIG. 3 illustrates a load/lock system 300 that load/lock apparatus 200 may be a part of. Load/lock system 300 may be used to transfer wafer 201 to or from a vacuum environment for inspection. Load/load apparatus 200 (as indicated by a bracket) may be sealed by an enclosure (not shown) so that a vacuum may be drawn. Load/lock system 300 itself may be arranged in a sealed chamber. As shown in FIG. 3, load/lock system 300 may include a pump 301. Pump 301 may be used to evacuate a chamber until a predetermined level of vacuum is reached. For example, pump 301 may be configured to run until at least $10^{-5}$ torr is reached. Then, wafer 201 may be transferred to another location for inspection. A damper 302 may be provided. Damper 302 may be used to alleviate the effect of vibrations from pump 301 on wafer 201. A pump gate valve 303 may be provided. Pump gate valve 303 may be used to switch pump 301 on or off.

Sensor 250 may be mounted on a component of load/lock system 300. Sensor 250 may be attached to a mount 305. Sensor 250 may be configured to project a light beam onto wafer 201. An opening, such as a channel, view port, or holes, etc., may be provided to allow the light beam to travel from sensor 250 to a surface of wafer 201. For example, a top plate 260 may include an opening through which a beam projected from sensor 250 may pass to reach wafer 201.

Sensor 250 may be mounted on a component of a charged particle beam apparatus. For example, sensor 250 may be mounted on load/lock system 300, as discussed above. In some embodiments, sensor 250 may be arranged on a SEM column. Sensor 250 may be positioned to be above a wafer when the wafer is positioned in a processing position. Sensor 250 may be installed in a charged particle beam apparatus such as those shown in U.S. App. No. 62/787,128, which is incorporated herein by reference in its entirety. Sensor 250 may be used to measure a property of wafer 201 prior to performing processing on wafer 201. For example, sensor 250 may measure a tilt of wafer 201 and may be used to ensure that wafer 201 is level before conducting inspection.

Figure 4:
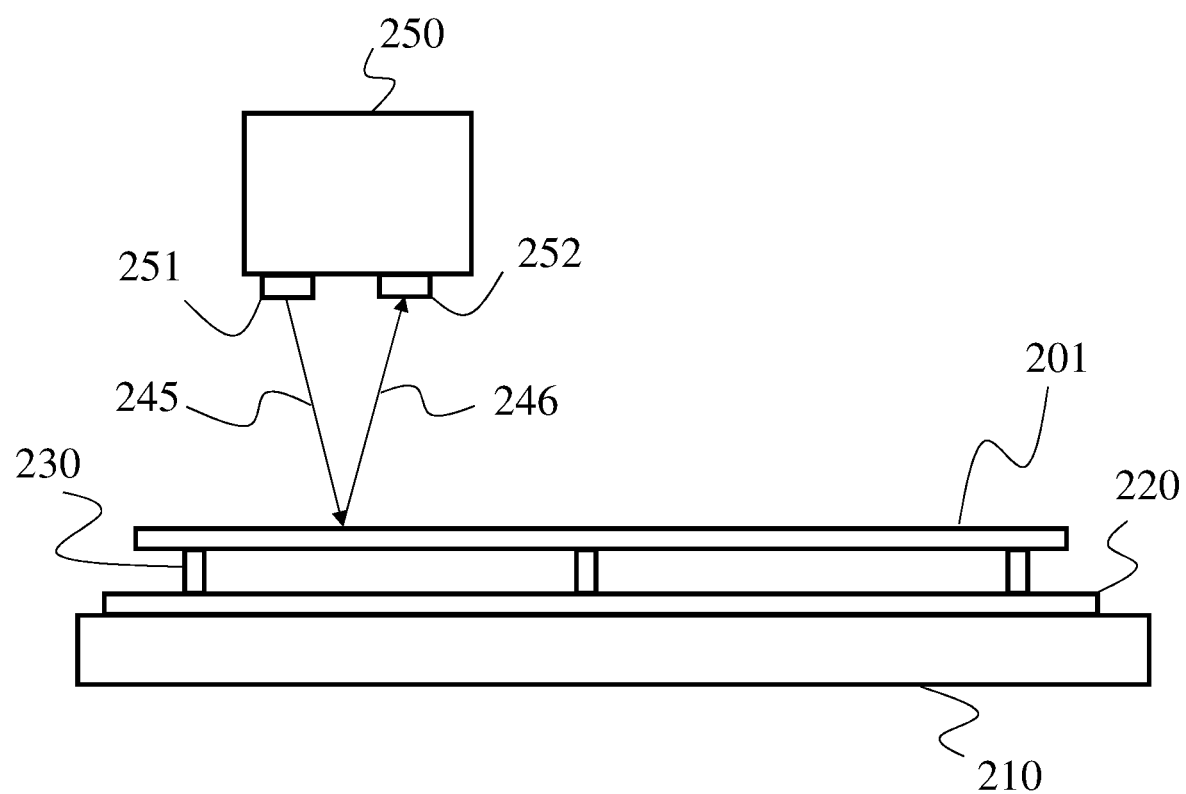
FIG. 4 is an enlarged schematic view of an exemplary structure and interaction of a sensor, consistent with embodiments of the present disclosure.

FIG. 4 is an enlarged schematic view of an exemplary structure of sensor 250 showing an interaction with wafer 201. Sensor 250 may include an emitter 251 and a receiver 252. Emitter 251 may be configured to emit beam 245. Beam 245 may be a laser beam. Beam 246 may be formed by a reflection of beam 245 off a surface of wafer 201. Receiver 252 may be configured to receive beam 246. Receiver 252 may be configured to generate an output in response to receiving energy of a beam. Receiver 252 may include a photodiode. Sensor 250 may be configured to detect a tilt of wafer 201. Sensor 250 may be configured to determine the tilt of wafer based on an output signal that is generated by incidence of a beam on receiver 252. If wafer 201 is tilted, beam 246 may be directed to a location other than that of receiver 252 and an output of sensor 250 may change. Although FIG. 4 shows beam 245 being projected onto wafer 201 at an oblique angle, it will be understood that beam 245 may be directed onto wafer 201 perpendicularly. Furthermore, it will be understood that a cooperative target may be separately provided on wafer 201, and beams may be directed onto the cooperative target rather than directly onto wafer 201.

Figure 5A:
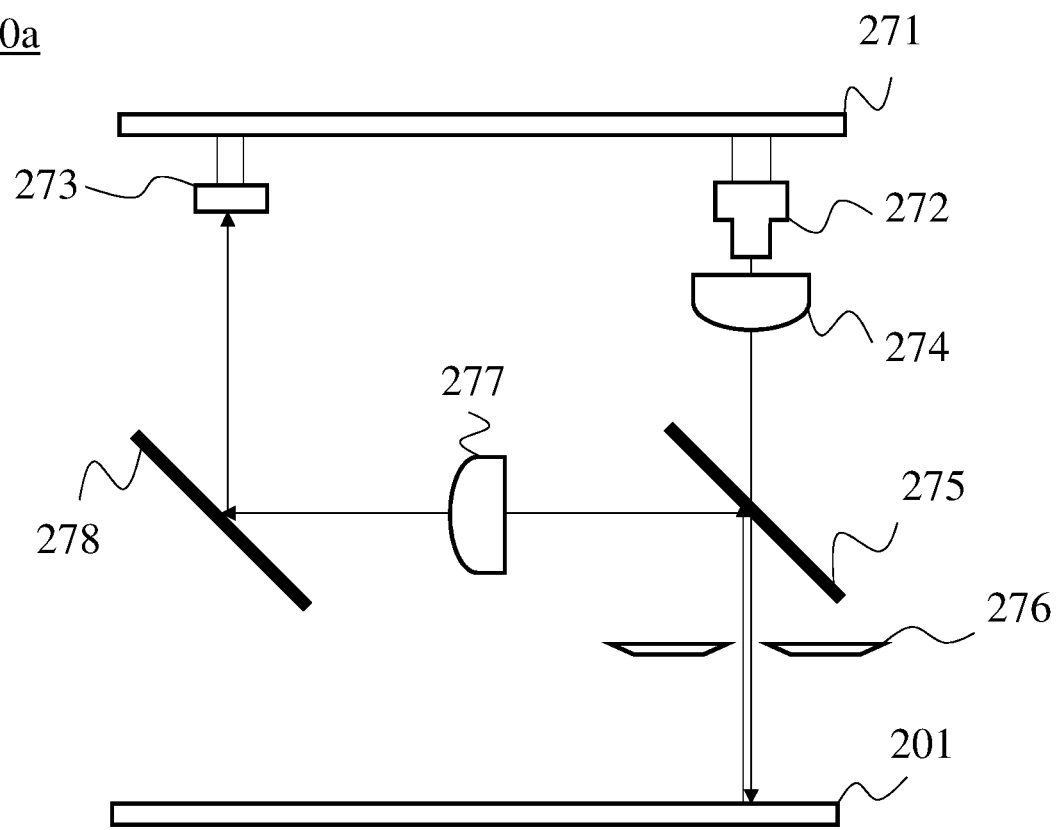
FIG. 5A and FIG. 5B are diagrams illustrating an exemplary detailed structure of a sensor, consistent with embodiments of the present disclosure.

FIG. 5A shows a detailed structure of a sensor 250a that may be one example of sensor 250. Sensor 250a may include a circuit board 271. Circuit board 271 may be a printed circuit board (PCB). Circuit board 271 may be a substantially planar member. Use of a circuit board may be useful to achieve economic and compact construction of a sensor. Sensor 250a may include a light source 272. Light source 272 may be mounted on circuit board 271. Light source 272 may be configured to irradiate an object. Light source 272 may be configured to generate a laser beam. Light source 272 may include a laser diode, LED, or filament, etc. Sensor 250a may include a sensing element 273. Sensing element 273 may include a photodiode. Sensing element 273 may be mounted on circuit board 271. Light source 272 and sensing element 273 may be arranged substantially on the same plane.

Sensor 250a may include optical elements, such as lenses, deflectors, mirrors, filters, beam splitters, optics, etc. As shown in FIG. 5A, sensor 250a may include a collimator 274. Collimator 274 may be configured to collimate light coming from light source 272. Collimator 274 may include a collimation lens. In addition to a lens, other structures may be employed, such as a deflector. Light exiting collimator 274 may form a substantially collimated beam. Collimator 274 may be configured to form a collimated beam in a particular direction. Collimator 274 may be configured to supply light from light source 272 along the particular direction. Collimator 274 may be configured to filter out light rays traveling through collimator 274 in directions other than the particular direction such that substantially only light rays traveling in the particular direction pass through. Light from collimator 274 may be directed toward wafer 201. One or more other optical elements may be arranged between light source 272 and wafer 201.

Sensor 250a may include a beam splitter 275. Beam splitter 275 may be configured to supply light selectively. For example, beam splitter 275 may be configured to pass light that is input to beam splitter 275 in a first direction and reflect light that is input to beam splitter 275 in a second direction. In the configuration shown in FIG. 5A, the first direction may be a direction from light source 272 to beam splitter 275. The second direction may be a direction from wafer 201 to beam splitter 275. The first direction and the second direction may be opposite one another. An example of first and second directions is shown in FIG. 6A.

Figure 6A:
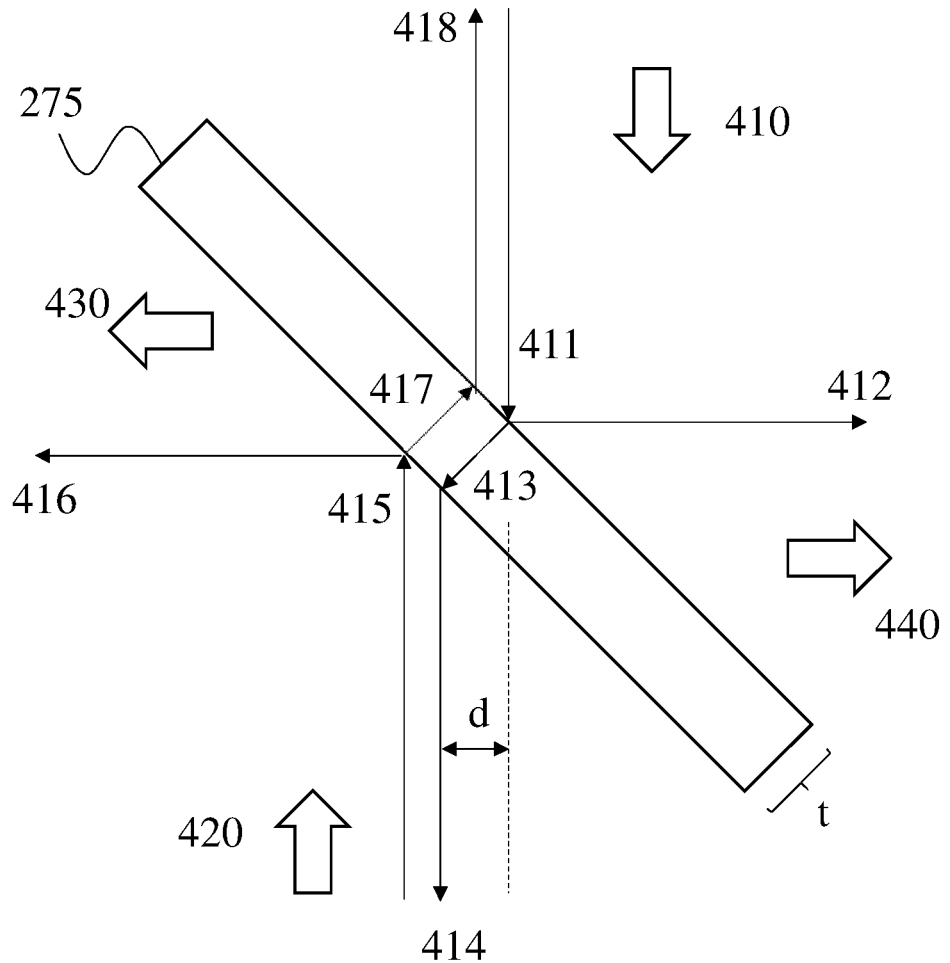
FIG. 6A through FIG. 6D are diagrams illustrating an exemplary detailed structure of a beam splitter, consistent with embodiments of the present disclosure.

FIG. 6A illustrates light propagation behavior through beam splitter 275. Light may be input into beam splitter 275 by a light source. Light reflected from a sample may also be input into beam splitter 275. As shown in FIG. 6A, a first light beam 411 may be directed toward beam splitter 275. First light beam 411 may be from light source 272, having passed through collimator 274 (see FIG. 5A). Beam splitter 275 may have a plurality of principal directions. As shown in FIG. 6A, there may be a first direction 410, a second direction 420, a third direction 430, and a fourth direction 440. First through fourth directions 410, 420, 430, 440 may define coordinate axes. First direction 410 and second direction 420 may be opposite to one another. First direction 410 and second direction 420 may be parallel. As shown in FIG. 6A, first direction 410 and second direction 420 may both be toward beam splitter 275 at the positions indicated by the solid arrows.

Similarly, third direction 430 and fourth direction 440 may be opposite to one another. Third direction 430 and fourth direction 440 may be parallel. As shown in FIG. 6A, third direction 430 and fourth direction 440 may both be away from beam splitter 275 at the positions indicated by the solid arrows.

First light beam 411 may be input to beam splitter 275. Some light from first light beam 411 may be reflected in fourth direction 440. A second light beam 412 may be emitted from beam splitter 275. Second light beam 412 may be outputted from beam splitter 275 in fourth direction 440. Second light beam 412 may be directed toward another optical element. Second light beam 412 may be absorbed by a light-absorbing element so that it does not interfere with other sensor components.

Some light from first light beam 411 that is input to beam splitter 275 may be transmitted through beam splitter 275. A third light beam 413 may travel from one side of beam splitter 275 to an opposite side of beam splitter 275 where light may exit. Beam splitter 275 may output a fourth light beam 414. Fourth light beam 414 may be directed toward a sample. The emission direction of fourth light beam 414 from beam splitter 275 may be first direction 410. Fourth light beam 414 may be output from beam splitter 275 with an offset d. For example, beam splitter 275 may have a thickness t, and light may be refracted as it travels through beam splitter 275. In some embodiments, a compensator plate may be provided that may be configured to cancel offset d.

The proportion of light divided among second light beam 412 and fourth light beam 414 may be determined by properties of beam splitter 275. Properties of beam splitter 275 may be determined based on its construction or material makeup, etc. Beam splitter 275 may be a plate-type beam splitter. Beam splitter 275 may have properties of transmittance and reflectance. Beam splitter 275 may be configured such that a first proportion of light input into beam splitter 275 in a first direction passes through beam splitter 275 and a second proportion of light input into beam splitter 275 in a second direction is reflected toward another direction.

As shown in FIG. 6A, a fifth light beam 415 may be directed toward beam splitter 275. Fifth light beam 415 may be from wafer 201, having been reflected from the surface of wafer 201 and passing through an aperture 276 (see FIG. 5A), or not yet having passed through aperture 276 (see FIG. 5B). Fifth light beam 415 may be directed toward beam splitter 275 in second direction 420. Fifth light beam 415 may be inputted to beam splitter 275. Some light from fifth light beam 415 may be reflected in third direction 430. A sixth light beam 416 may be emitted from beam splitter 275. Sixth light beam 416 may be outputted from beam splitter 275 in third direction 430. Sixth light beam 416 may be directed toward another optical element.

Some light from fourth light beam 414 that is inputted to beam splitter 275 may be transmitted through beam splitter 275. Similar to third light beam 413, a seventh light beam 417 may travel from one side of beam splitter 275 to an opposite side of beam splitter 275 where light may exit. Beam splitter 275 may output an eighth light beam 418. The emission direction of eighth light beam 418 from beam splitter 275 may be second direction 420. Eighth light beam 418 may be directed toward another optical element. Eighth light beam 418 may be absorbed by a light-absorbing element so that it does not interfere with other sensor components. Eighth light beam 418 may be outputted from beam splitter 275 with an offset, and eighth light beam 418 may be directed toward a light-absorbing element (not shown) spaced apart from light source 272 or collimator 274 (see FIG. 5A). The proportion of light divided among sixth light beam 416 and eighth light beam 417 may be determined by properties of beam splitter 275.

Figure 6B:
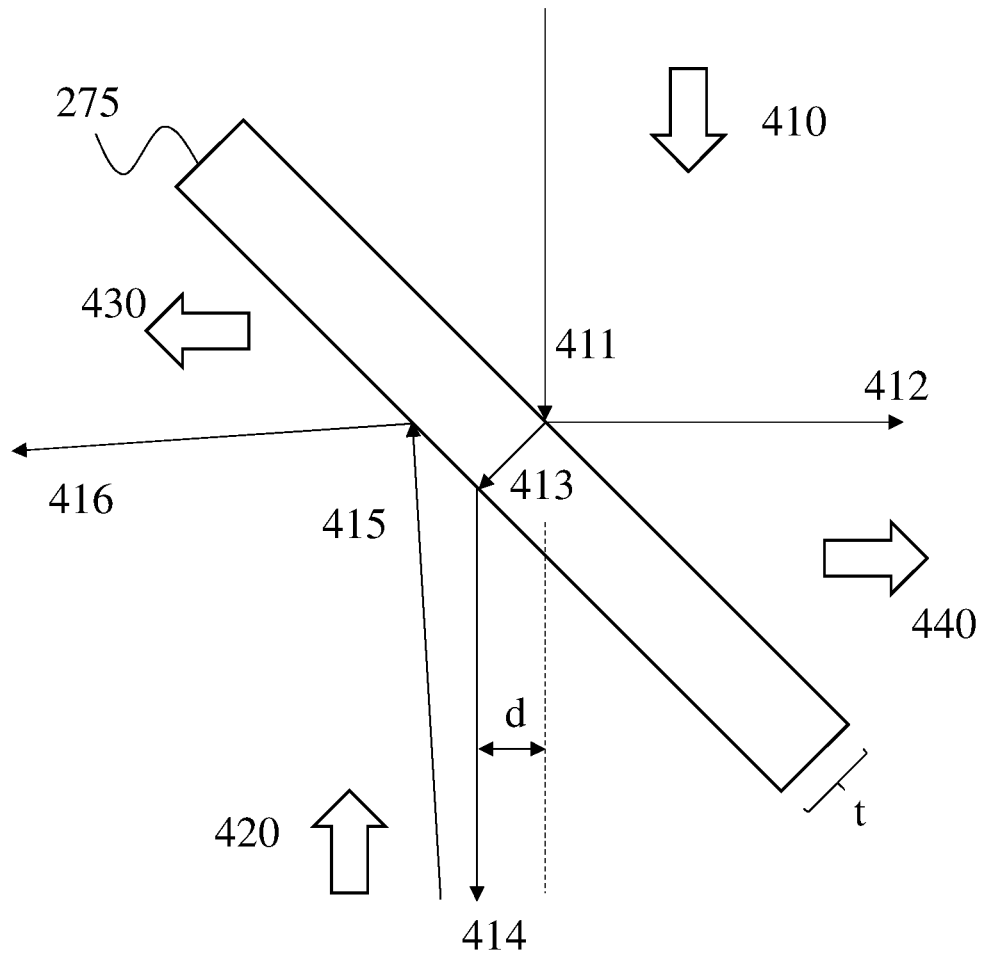

As shown in FIG. 6B, light traveling back toward beam splitter 275 may be inclined relative to a projection direction of light emitted from beam splitter 275. For example, fourth light beam 414 may be directed toward a sample perpendicularly. The sample may be tilted, or irregular, for example, and thus fifth light beam 415 may travel back toward beam splitter 275 at an angle. As a result, sixth light beam 416 may be outputted from beam splitter 275 obliquely.

As shown in FIG. 5A, sensor 250a may include aperture 276. Aperture 276 may refer to an opening formed in a material. For example, aperture 276 may be formed by a plate having a hole. Some light that is projected on aperture 276 may pass through and some may be cut off by aperture 276. Aperture 276 may have a size configured to allow a predetermined amount of light to be projected onto wafer 201. Aperture 276 may be configured as a beam-limit aperture. In some embodiments, aperture 276 may be configured to allow a beam of a predetermined diameter to pass through.

Sensor 250a may include a focal lens 277. Focal lens 277 may be configured to form an image of light source 272. The image may be formed at a focal plane. Light rays passing through focal lens 277 may be focused to a point at the focal plane. Focal lens 277 may be arranged between aperture 276 and sensing element 273. More specifically, focal lens 277 may be arranged between beam splitter 275 and a mirror 278. Focal lens 277 may be configured to form a focal plane at a plane where sensing element 273 is arranged. Light supplied from focal lens 277 may be focused onto sensing element 273.

Sensor 250a may include mirror 278. Mirror 278 may be configured to direct light toward sensing element 273. Light passing through focal lens 277 may be reflected off mirror 278 and be directed to sensing element 273.

In operation of sensor 250a, a collimated beam may pass through an aperture and eventually impinge on a photodetector, such as a photodiode. For example, a collimated beam formed by light source 272 and collimator 274 may be supplied through beam splitter 275, pass through aperture 276, and impinge on wafer 201. A reflected beam may travel back through aperture 276, reflect off beam separator 275, and be input into focal lens 277. Collimated rays of the reflected beam may be focused by focal lens 277 such that a focus is formed at sensing element 273. Light incident on sensing element 273 may be used for detection. For example, when sensor 250a is used as a tilt sensor, tilting of wafer 201 may affect the amount or intensity of light incident on sensing element 273. When wafer 201 is tilted, light reflected off the surface of wafer 201 may be cut by aperture 276. The amount of light then transmitted through focal lens 277 and eventually directed to sensing element 273 may decrease. Thus, output from a photodiode that may form sensing element 273 may be lower, and a degree of tilt may be determined.

Figure 5B:
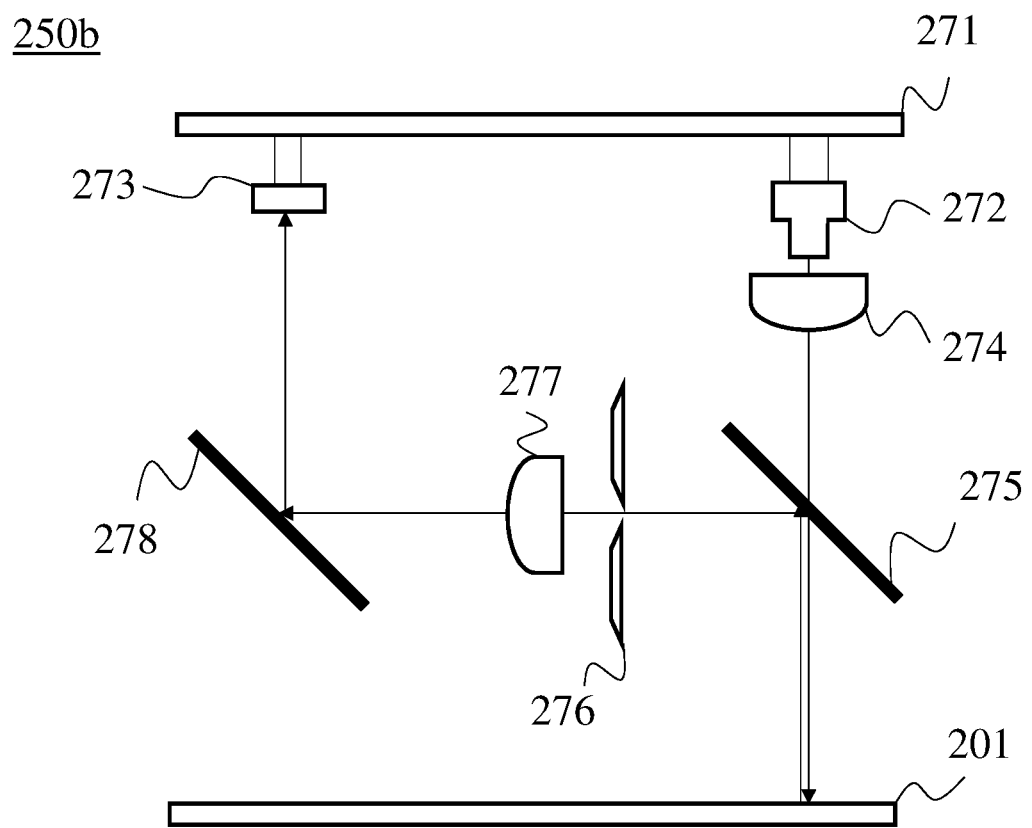
Figure 6C:
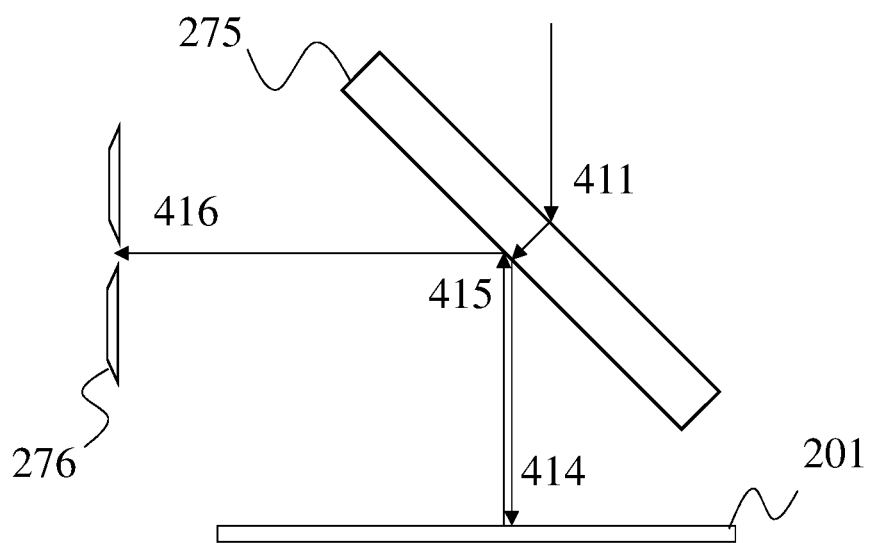
Figure 6D:
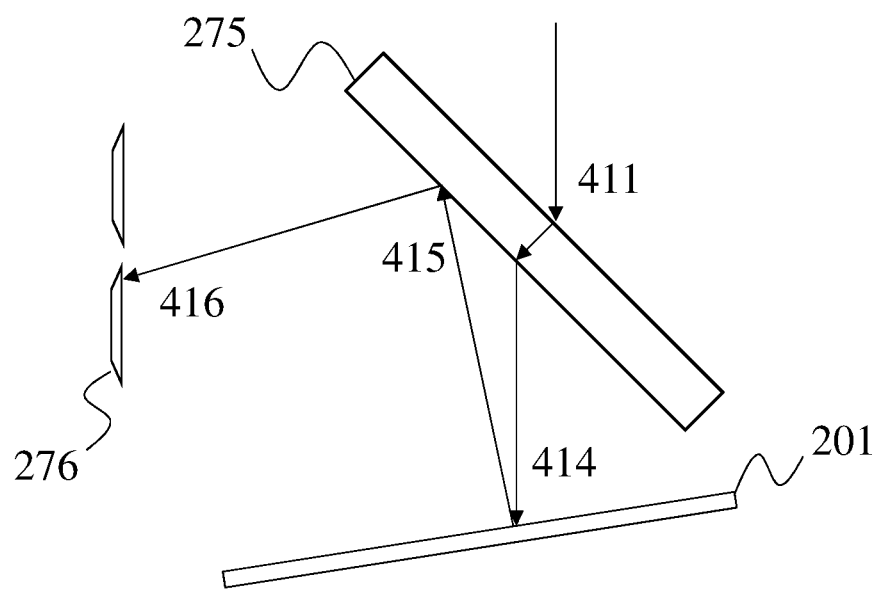

FIG. 6C and FIG. 6D illustrate an effect of tilting of wafer 201. As shown in FIG. 6C, when wafer 201 is level, fourth light beam 414 may be reflected off wafer 201, forming fifth light beam 415, and fifth light beam 415 may be input into beam splitter 275. Fifth light beam 415 may be reflected off beam splitter 275, forming sixth light beam 416, and sixth light beam 416 may then pass through aperture 276. This light may eventually reach sensing element 273 (see FIG. 5B).

As shown in FIG. 6D, however, when wafer 201 is tilted, light output from beam splitter 275 may be cut off by aperture 276. It will be understood that light beams, although illustrated as single lines, may include a column of light having a width and distribution of angles and energy. Light passing through a collimator may include light rays with a distribution of angles that are substantially equal (e.g., all rays are substantially parallel to one another). When wafer 201 is level, substantially all of the light of sixth light beam 416 may pass through aperture 276. When wafer 201 is tilted, some light may pass through aperture 276, while some light does not. The intensity of light detected at sensing element 273 may change due to the angle of light output from sensing element 275, and as a result, some light being blocked from traveling to sensing element 273.

A sensor may include a component configured to change the amount of reflected light passing through it as the tilt of wafer 201 increases. The component may be configured to reduce the amount of light passing through it as the tilt of wafer 201 increases. The component may include aperture 276. As wafer 201 tilts, an emission angle of light reflected from wafer 201 may change. The change in angle of the light reflected from wafer 201 may cause the amount or intensity of light passing through the component to be altered.

Sensor 250a may be configured to determine a tilt of wafer 201 based on a change in the properties of light incident on sensing element 273. The properties may include, for example, amount or intensity of the light. Change in the amount of light on sensing element 273 may correspond to the tilt of wafer 201. For example, reflected light that reaches sensing element 273 may change based on the tilt of wafer 201 due to light being cut off by aperture 276. However, light source 272 may also exhibit power variation. Furthermore, wafer 201 may have reflectivity variation. For example, the amount of light reflected off wafer 201 may vary from location to location, even when wafer 201 is not tilted. Thus, change in the output of sensing element 273 may not always accurately reflect the tilt of wafer 201 in all circumstances.

Additionally, sensor 250a may include only a single sensing element 273. Aperture 276 may be relatively large to allow a sufficient amount of light to reach sensing element 273. For example, a size of aperture 276 may be approximately 2 mm in diameter. A large aperture size may cause ambient light to leak into sensor 250a and reach sensing element 273. Ambient light may contribute to noise. Thus, signal-to-noise ratio (SNR) may be degraded.

FIG. 5B shows a detailed structure of a sensor 250b that may be another example of sensor 250. Sensor 250b may be similar to sensor 250a except that location of aperture 276 is modified. For example, in FIG. 5B, aperture 276 is arranged between beam splitter 275 and focal lens 277. In some embodiments (not shown), aperture 276 is arranged between focal lens 277 and mirror 278, or between mirror 278 and sensing element 273. In some embodiments, mirror 278 is not included as part of sensor 205a or sensor 250b. In some embodiments where mirror 278 is not included, aperture 276 may be arranged between focal lens 277 and sensing element 273. In the arrangement of FIG. 5B, light passes through aperture 276 only once. Sensor 250b may allow a greater amount of collimated light to reach wafer 201. Therefore, a greater amount of light may be reflected back into beam splitter 275. A relatively larger amount of reflected light may be passed through aperture 276, while aperture 276 still functions to cut off some light. Sensor 250b may allow for a larger signal generation in sensor 273.

In some embodiments, light source 272 may be formed by an aperture through which light from another source passes. For example, although the figures herein may show a structure of a light source, such as a light emitting diode mounted on a circuit board, light source 272 may be formed by an opening in the circuit board (or another structure) through which light from another source is transmitted. The opening of light source 272 may constitute a beam-limit aperture.

As shown, for example with respect to sensor 250a and sensor 250b in FIG. 5A and FIG. 5B, a sensor may use only a single sensing element. Such a sensor may be susceptible to single-channel signal variation. This may be due to power variation in a light source module. To cancel power source variation, a self-differential method may be used.

A self-differential method may employ a plurality of sensing elements. A common mode may be provided to act as a reference. For example, a sensor may be configured such that a reference beam is directed to a first sensing element. A second sensing element may be used for determining a property of a sample that is based on a comparison to the reference beam.

Figure 7A:
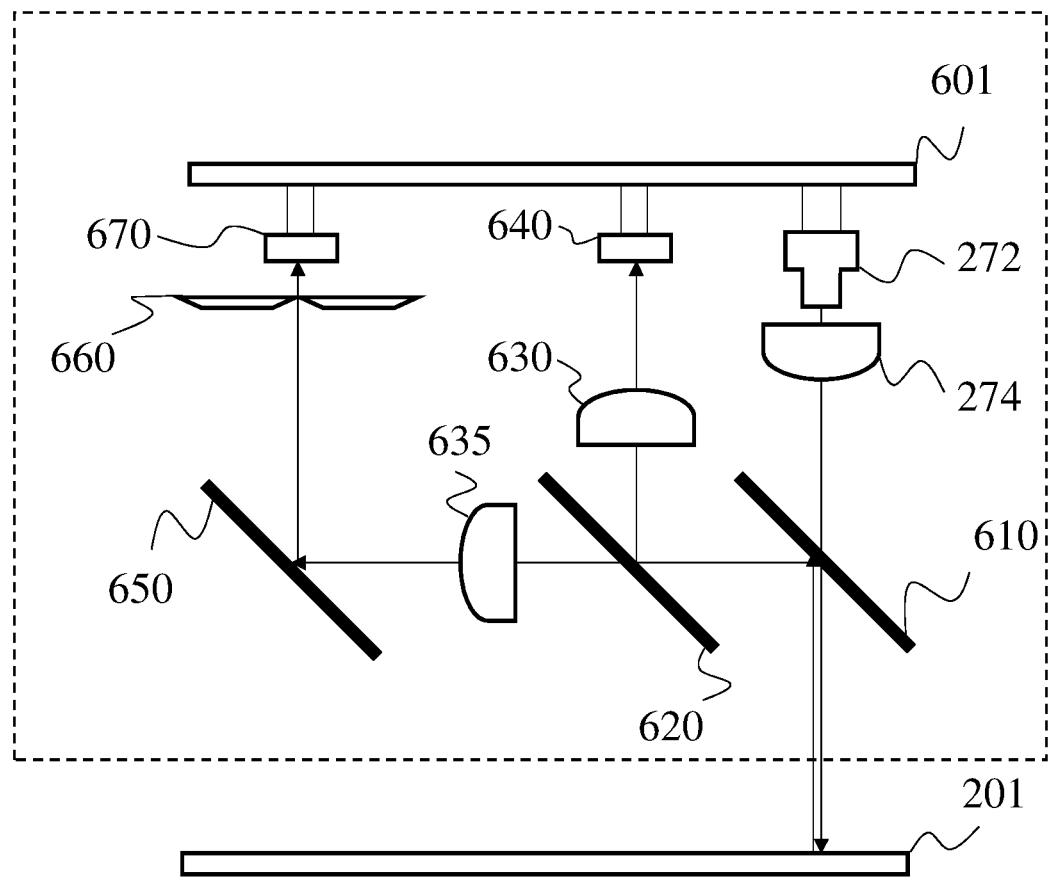
FIG. 7A and FIG. 7B are diagrams illustrating an exemplary detailed structure of a sensor, consistent with embodiments of the present disclosure.

FIG. 7A shows a detailed structure of a sensor 600 (sensor 600 being indicated by a dash-line rectangle). Sensor 600 may include a base 601. Base 601 may be a circuit board, such as a PCB. Base 601 may be a substantially planar member upon which other components may be provided. Sensor 600 may include light source 272, similar to that discussed above. Light source 272 may be mounted on base 601. Light source 272 may be configured to irradiate a sample, such as wafer 201. Sensor 600 may include a first sensing element 640. First sensing element 640 may include a photodiode. First sensing element 640 may be mounted on base 601. Sensor 600 may also include a second sensing element 670. Second sensing element 670 may include a photodiode. Light source 272, first sensing element 640, and second sensing element 670 may be arranged substantially on the same plane. A beam incident on first sensing element 640 may be used as a reference, as shall be discussed below.

Sensor 600 may include optical elements. As shown in FIG. 7A, sensor 600 may include collimator 274, similar to that discussed above. Collimator 274 may be configured to supply light from light source 272 along a first direction. The first direction may be from base 601 to collimator 274. The first direction may be towards wafer 201. Light from collimator 274 may be directed toward wafer 201. As seen in the view of FIG. 7A, the first direction may be downward toward wafer 201.

Sensor 600 may include a first optical element 610. First optical element 610 may include a beam splitter, such as beam splitter 275, discussed above. First optical element 610 may be configured to supply light input therein in a plurality of directions. First optical element 610 may be oriented in sensor 600 so that one of its light supply directions may be aligned with an emission direction of light source 272. First optical element 610 may be configured to pass light input therein in a first direction and to reflect light input therein in a second direction. The first direction may be downward, as seen in FIG. 7A. The second direction may be opposite to the first direction. The second direction may be upward, as seen in FIG. 7A.

Light from collimator 274 may be input into first optical element 610. This light may be input into first optical element 610 in the first direction. First optical element 610 may output this light such that it proceeds toward wafer 201. Light may be supplied to wafer 201 by passing through first optical element 610 in the first direction. Light reflected back from wafer 201 may also be input into first optical element 610. The light reflected back from wafer 201 may be input into first optical element 610 in the second direction. First optical element 610 may output this light in a third direction. The third direction may be perpendicular to the first direction or the second direction. As shown in FIG. 7A, light is output from first optical element 610 in a third direction (left) toward a second optical element 620. In the state shown in FIG. 7A, the third direction is perpendicular to the first direction and the second direction. It will be understood that light reflected back from wafer 201 may not always travel straight back toward first optical element 610. For example, when wafer 201 is tilted, light input into first optical element 610 from wafer 201 may be inclined relative to light input into first optical element 610 in the second direction in the state shown in FIG. 7A. Accordingly, light output from first optical element toward second optical element 620 may be directed obliquely. Light output generally in the third direction may be inclined relative to the first direction. The third direction may remain perpendicular to the second direction. First optical element 610 may be configured to direct light perpendicularly relative to its input direction. Second optical element 620 may be configured similarly.

Second optical element 620 may include a beam splitter, such as beam splitter 275. Second optical element 620 may be configured to supply light input therein in a plurality of directions, similar to first optical element 610. Second optical element 620 may be oriented in sensor 600 so that one of its light supply directions may be aligned with an output direction of first optical element 610.

Second optical element 620 may be configured to change a property of a beam passing through it. A light beam input to second sensing element 620 may be transmitted through second optical element 620. A property of the transmitted light beam may change depending on a tilt of wafer 201. The property may include an amount of light of the beam. The property may include intensity of the beam. The property may include brightness of a spot formed by the beam on a sensing element.

Second optical element 620 may be configured to divide and transmit light input therein in the third direction in a plurality of directions. Light input to second optical element 620 in the third direction may be output in a fourth direction and a fifth direction. The fourth direction may be similar to the second direction (e.g., upward in FIG. 7A). The fourth direction may be parallel to the second direction. Here, the "fourth direction" may be different from the "fourth direction" discussed above with respect to FIG. 6A. The fourth and fifth directions may be associated with second optical element 620. The fifth direction may be similar to the third direction (e.g., left in FIG. 7A). The fifth direction may be parallel to the third direction. Second optical element 620 may be configured to divide a predetermined proportion of light among its outputs, e.g., light emitted in the fourth and fifth directions. A division of light between the fourth and fifth directions may be set based on a construction or a material makeup of second optical element 620, for example. Similar to the description of first optical element 610 above, when wafer 201 is tilted, light output from second optical element 620 may be inclined relative to light output from second optical element 620 in the fourth and fifth directions in the state shown in FIG. 7A.

Properties of first optical element 610 and second optical element 620 may be different. For example, in some embodiments, first optical element 610 may be configured to have high reflectance while second optical element 620 is configured to have high transmittance. First optical element 610 may be configured to output as much light as possible in the second direction (e.g., toward wafer 201), and to reflect as much light as possible in the third direction (e.g., left toward second optical element 620). In some embodiments, first optical element 610 may be configured to reduce loss.

Second optical element 620 may be configured to split and output light along a plurality of beam paths. A path of a beam output from second optical element 620 may proceed from second optical element 620 to first sensing element 640. A path of another beam output from second optical element 620 may proceed from second optical element 620 to second sensing element 670. A "beam path" may be defined as a path that a beam takes subsequent to being output from an optical element that divides an input beam into a plurality of output beams, such as a beam splitter. A beam path may be associated with an optical element.

Sensor 600 may include a first lens 630. First lens 630 may include a collective lens. First lens 630 may be configured to focus light input therein. First lens 630 may focus light onto first sensing element 640. First lens 630 may be arranged between second optical element 620 and first sensing element 640. First lens 630 may be arranged on a first beam path proceeding from second optical element 620.

Sensor 600 may include a second lens 635. Second lens 635 may be arranged on a second beam path proceeding from second optical element 620. Second lens 635 may include a focusing lens, such as focal lens 277 of FIG. 5A and FIG. 5B. Second lens 635 may be configured to focus light input therein. Second lens 635 may form an image at a focal plane. Light rays passing through second lens 635 may be focused to a point at the focal plane. Second lens 635 may be arranged between second optical element 620 and second sensing element 670. Second lens 635 may be arranged between second optical element 620 and an aperture 660. In some embodiments, second lens 635 may be arranged between second optical element 620 and a third optical element 650. Second lens 635 may be configured to form a focal plane at a plane where aperture 660 is arranged. Light supplied from second lens 635 may be focused onto a point at the center of the opening of aperture 660.

Aperture 660 may be provided in sensor 600. Aperture 660 may refer to an opening formed in a material. For example, similar to aperture 276, aperture 660 may be formed by a plate having a hole. Aperture 660 may include a pinhole. Compared to aperture 276, aperture 660 may have a significantly smaller opening. Light may be configured to be focused at the center of aperture 660 by second lens 635. Second lens 635 may be configured to focus light to a pinpoint. Thus, aperture 660 may be configured to have an opening at the pinpoint location where second lens 625 is configured to focus a beam. The size of aperture 660 may be based on a focusing power of second lens 635. In some embodiments, aperture 660 may have an opening that is less than or equal to 500 μm. In some embodiments, aperture 660 may have an opening that is less than or equal to 100 μm.

Aperture 660 may be arranged near sensing element 670. Sensing element 670 may be directly downstream of aperture 660. Second lens 635 may be configured to focus light at a focal plane on which aperture 660 is arranged. As a distance from the focal plane increases, the greater the light may be dispersed. Therefore, it may be advantageous to position sensing element 670 as close as possible to the focal plane of second lens 635. This may enable a size of sensing element 670 to be minimized.

Sensor 600 may include third optical element 650. Third optical element 650 may be arranged on the second beam path proceeding from second optical element 620. Third optical element 650 may be configured to change a propagation direction of light output from second optical element 650. Third optical element 650 may be configured to output a beam in a direction perpendicular to a direction in which a beam is input, and may output a beam with little to no loss. Third optical element 650 may be a mirror. Third optical element 650 may be arranged downstream of second lens 635 in sensor 600 on the second beam path of second optical element 620.

Also arranged on the second beam path may be aperture 660 and second sensing element 670. Thus, second optical element 620 may be configured to transmit light along a first beam path toward a first sensing element, and to transmit light along a second beam path toward a second sensing element.

Sensor 600 may be configured to be resistant to height changes of a sample. For example, in operation, sensor 600 may detect a tilt of wafer 201. Sensor 600 may detect tilt independent of sample height. As shown in FIG. 7A, collimated light output from collimator 274 is incident on wafer 201. A collimated beam may consist substantially of light rays that are parallel to one another. In comparison, a converging or diverging beam may include light rays at angles relative to one another. For a converging or diverging beam, the longer the beam path, the more convergence (or divergence) the beam may experience. Therefore, the ultimate amount of light received on a sensing element may differ depending on a distance that a beam travels because a beam spot may be broadened. It may be desirable to provide a sensor that is not sensitive to sample height in a SEM to enhance flexibility in sample loading. Furthermore, in some embodiments, it may be desirable to lengthen the distance between a sample and other components of a system (e.g., lower the sample height). For example, in a SEM system, increasing the distance between a sample and the electrodes of the SEM may be helpful to reduce high-voltage arcing risk. Using a tilt sensor that allows a sample to be placed a large distance away may enhance flexibility.

Sensor 600 may detect a tilt of a sample based on output of first sensing element 640 and second sensing element 670. Properties of light beams that may be incident on first sensing element 640 and second sensing element 670 may change depending on the tilt of the sample. Referring to FIG. 7A, when wafer 201 is tilted, a beam spot intensity on first sensor 640 may remain substantially the same relative to an un-titled state while a beam spot intensity of second sensing element 670 may be significantly reduced relative to the un-tilted state. Aperture 660 may cut the focused light beam directed toward second sensing element 670 such that beam spot intensity on second sensing element 670 is suddenly drastically reduced. Meanwhile, the beam spot on first sensing element 640 may have shifted slightly due to the tilt of wafer 201, but because reflected light from wafer 201 does not pass through an aperture to reach first sensing element 640, its intensity should remain substantially unchanged. When an output of second sensing element 670 changes significantly while an output of first sensing element 640 remains substantially the same, it may be determined that wafer 201 is tilted.

A degree of tilt may be determined based on relative measures of sensing element output. As used herein, the term "output," "output signal," "sensing element output," or "output of a sensing element," etc., may refer to output of a sensing element or its associated circuit. For example, signal conditioning circuitries, front-end electronics, analog-to-digital converters (ADC), etc., may be attached to sensing elements. The output may refer to, for example, a raw signal generated by the sensing element or a processed signal from a circuit.

Output of first sensing element 640 or second sensing element 670 may correspond to an intensity of a beam received thereon. In some embodiments, output of a sensing element may be configured as a current signal. For example, sensor 600 may be configured such that output current I1 on first sensor 640 remains substantially unchanged even when wafer 201 is tilted as compared to an un-tilted state. Meanwhile, sensor 600 may be configured such that output current I2 on second sensor 670 decreases with a degree of tilt. A degree of tilt may be determined based on a relationship between I1 and I2. The relationship may be determined in advance and may be based on properties of optical elements included in sensor 600, such as transmittance properties of second optical element 620.

Figure 7B:
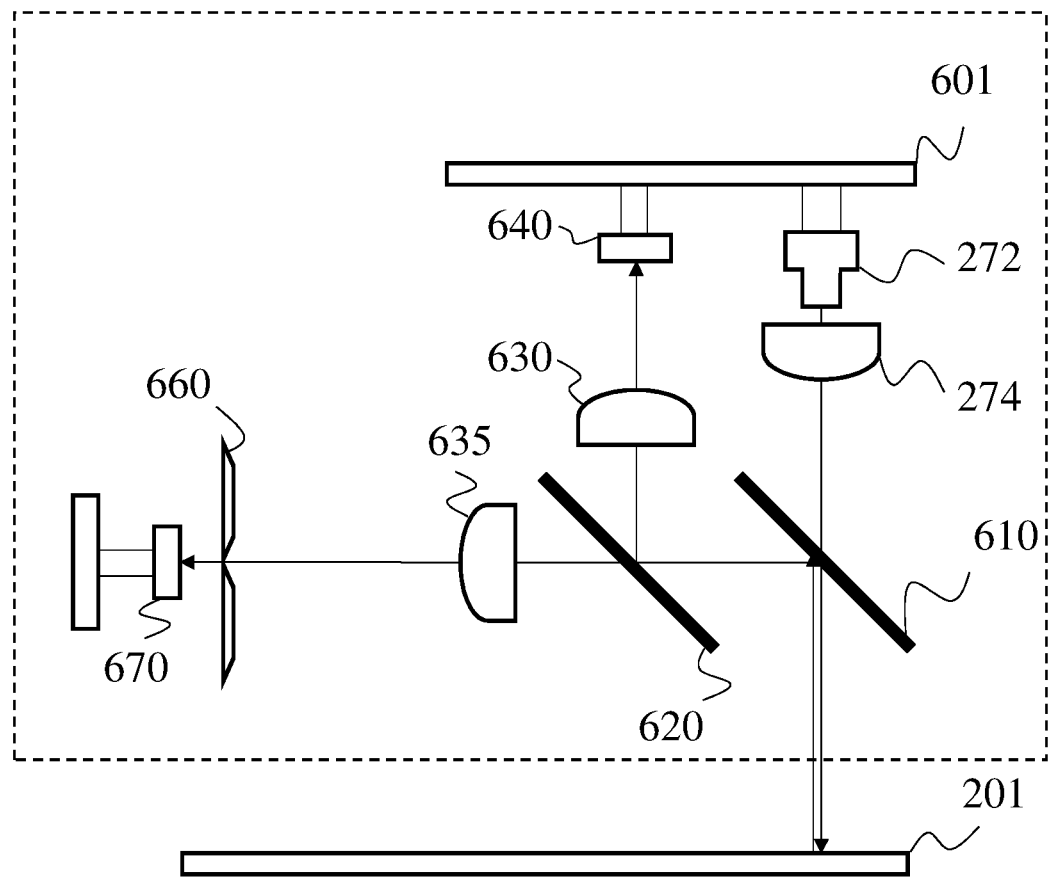

FIG. 7B illustrates a sensor 600*b*. Sensor 600*b* may be similar to sensor 600 except that third optical element 650 may be omitted and is not included as part of sensor 600*b*. Positions of aperture 660 and second sensing element 670 may be altered. Second sensing element 670 may be provided on its own circuit board.

Output from first sensing element 640 may be used to cancel an effect of variability. Light source 272 may exhibit variation due to, for example, power source variation or sample surface reflectivity variation. Thus, the intensity of a beam generated by light source 272 may change, and the intensity of a beam spot on first sensing element 640 or second sensing element 670 may change irrespective of a state of tilt of wafer 201. The output from first sensing element 640 may be used as a common reference signal because it may remain substantially unchanged even when wafer 201 is tilted. Output from second sensing element 670 may be compared to output from first sensing element 640 to determine whether wafer 201 is tilted or if a change in signal may be due to other phenomena, such as variability effects. A method of detecting tilt may include canceling power source variation. The method may include using a reference signal and comparing outputs from multiple sensing elements.

Sensor 600 may be useful for employing a confocal method of detection. In the comparative example of sensor 250a or sensor 250b, as discussed above with reference to FIG. 5A and FIG. 5B, aperture 276 may be configured to cut a collimated beam. For example, collimated light may be produced from collimator 274, and collimated light reflected from wafer 201 may be directed toward aperture 276. However, as shown in FIG. 7A and FIG. 7B, aperture 660 may be provided that is configured to cut a focused beam. Aperture 660 may include a pinhole that is confocal with light source 272. For example, second lens 635 may be configured to form an image of light source 272 at a focal plane, and aperture 660 may be arranged at the focal plane. Cutting a focused beam may be more sensitive than cutting a collimated beam. For example, a collimated beam may have a relatively broad beam width, and thus, when a sample is tilted, an aperture may only cut a portion of the collimated beam. In the example shown in FIG. 5B, when wafer 201 is tilted, only a portion of a collimated beam that is reflected from wafer 201 may be cut by aperture 276. This may result in a corresponding signal change in a sensing element that is relatively small. Especially, when aperture 276 is configured to have a large opening size, it may be difficult to determine whether signal fluctuation in a sensing element is due to tilt of wafer 201 or variability effects, such as light source power variation. In comparison, an aperture with a pinhole may be more sensitive because the aperture may cut a beam of more concentrated intensity. Furthermore, using an aperture with a smaller opening may be more effective in suppressing the effects of ambient light. A method of detecting tilt may include changing the amount of transmitted light through a component as the tilt of a sample increases. The method may include enhancing the sensitivity of sensing by increasing the degree with which the amount of transmitted light is changed as the tilt of the sample increases. The component may include an aperture with a pinhole.

Variability effects, such as light source power variation or sample surface reflectivity variation, as discussed above, may be present in a sensing system. A light source may generate a beam whose intensity may decay over time, for example. In some embodiments of the disclosure, variability effects may be addressed by using a self-differential method. For example, in some embodiments, a plurality of sensing elements may be provided in a sensor and the sensor may be configured to determine a parameter based on a relationship. A controller may be provided that is configured to determine the parameter using output from the sensor. The controller may be programmed to execute a method consistent with the present disclosure. In one configuration, a relationship between output current I1 of first sensing element 640 and output current I2 of second sensing element 670 may be determined in advance and used for determining a parameter. The relationship may be based on properties of components of sensor 600. A parameter, such as degree of tilt, may be determined based on a relationship such as I1-I2. In some embodiments, a parameter may be determined based on a relationship such as log(I1)-log(I2), which may be equal to log(I1/I2). The relationship may include an algorithm. Using such a relationship may help to eliminate common fluctuations that may be present in both I1 and I2.

Surface roughness of a sample may affect compatibility with a sensor for detecting tilt. A sample may have surface roughness that may be measured according to an ISO (International Organization for Standardization) grade. For example, a sample may be classified by an ISO grade number, such as those given in Table 1, according to its roughness value (Ra), which may be based on an arithmetic average value of a profile of a surface. The average value may be determined based on deviations from a given center line of the profile.

TABLE 1

| Roughness (N) | Roughness value (Ra) [μm] |
|---|---|
| N12 | 50 |
| N11 | 25 |
| N10 | 12.5 |
| N9 | 6.3 |
| N8 | 3.2 |
| N7 | 1.6 |
| N6 | 0.8 |
| N5 | 0.4 |
| N4 | 0.2 |
| N3 | 0.1 |
| N2 | 0.05 |
| N1 | 0.025 |

A sample with low surface roughness may be compatible with a wide variety of sensors, including those not necessarily having high sensitivity. For example, in some cases, a sample with surface roughness less than or equal to N9 may be used as a cooperative target with sensors having high sensitivity. A sample with relatively low surface roughness (e.g., less than or equal to N9), may mean that light reflected from the sample will behave predictably, and a sensor may be able to detect that even small changes in system output correspond to sample tilt. On the other hand, samples with surface roughness of N10 to N12 may be used as a cooperative target with sensors only at low sensitivity. A rough surface may cause unpredictable system output, and thus, a sensor may only be able to detect radical deviations as corresponding to sample tilt, and this sample tilt must be relatively extreme. With increasing surface roughness of a sample, detecting tilt of a sample may become more difficult, and mounting a separate cooperative target may be required. Using a self-differential method may be helpful to reduce the influence of a rough surface.

In some embodiments, modulation may be used to further enhance sensitivity and accuracy of a sensor. Light source 272 may be configured to emit a beam in a modulation pattern. For example, light source 272 may be configured to rapidly turn a beam on or off (e.g., switching between an on-state and an off-state of emission). A frequency of modulation may be on the scale of kHz. Second sensing element 670 may be configured to demodulate the beam. In some embodiments, a modulator and a demodulator may be provided. The modulator may be configured to generate a code, such as a random number (or pseudo random noise, "PN") code. A controller, such as controller 109 shown in FIG. 1, may include the modulator and demodulator. A deflector may be provided to modulate a beam generated by light source 272. Modulation is discussed in U.S. application Ser. No. 15/826,600, which is incorporated herein by reference in its entirety. Modulation may be useful to suppress the effect of ambient light and improve SNR. For example, a sensor may be configured to cancel the influence of ambient light that is detected during the off-state of emission of light source 272 against the on-state (e.g., positive duty cycle) of emission of light source 272. Modulation may enhance the usefulness of a sensor and increase its applicability to complicated lighting environments.

Figure 8:
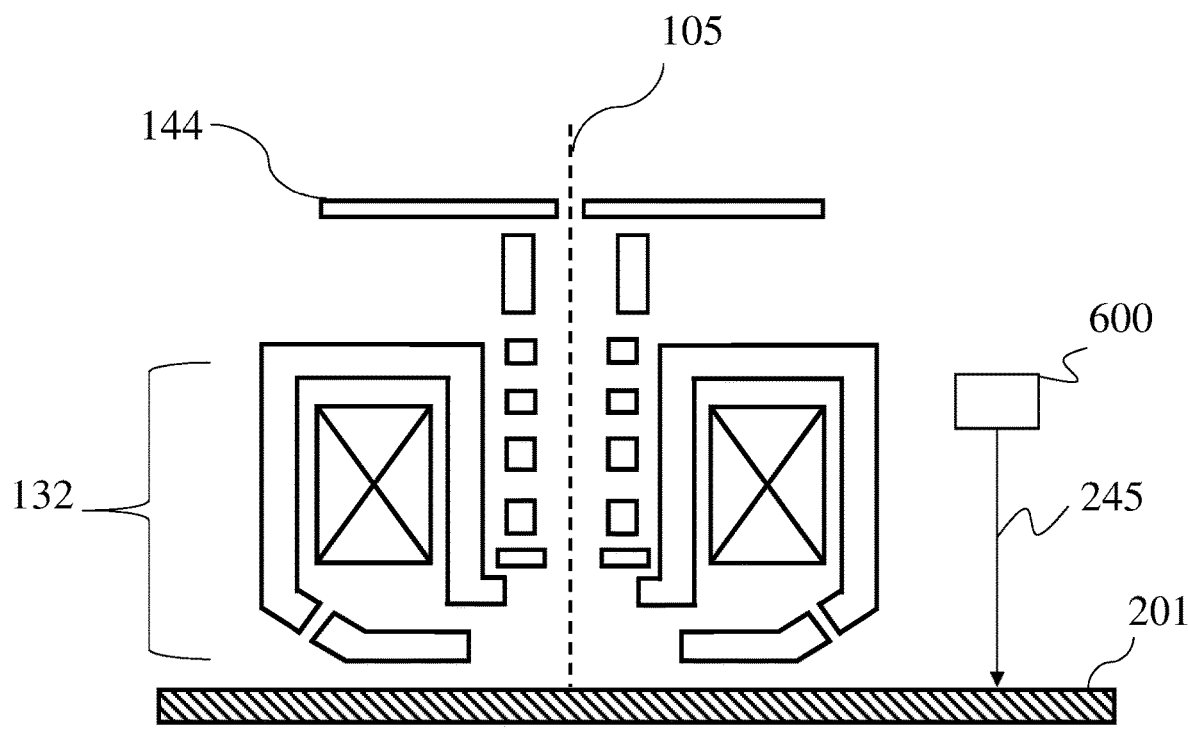
FIG. 8 is a view illustrating an exemplary SEM system including a sensor, consistent with embodiments of the present disclosure.

A sensor in accordance with embodiments of the present disclosure may include aspects of a self-differential method and confocal aperture, among others. A sensor may be applied in a SEM system for, e.g., wafer masks, or metal surface levelling. FIG. 8 shows an example of sensor 600 applied to a SEM. Sensor 600 may be configured to emit beam 245 parallel to an optical axis 105 of the SEM. The SEM may include an objective lens 132 and a detector 144, among other components, that are aligned with axis 105. A sensor may be similarly applied to a position sensor system. For example, a sensor may be configured to detect a vertical position of a wafer, such as in examples shown in U.S. Pat. No. 10,176,967, which is incorporated herein by reference in its entirety.

In some embodiments, a method of sensing a beam may be provided. The method may include directing light from a source onto a sample, receiving an output from a sensing element, and determining a value based on the output. The value may be a degree of tilt of the sample. The method may further include focusing light onto a focal plane, transmitting light through an aperture arranged at the focal plane, and projecting light onto the sensing element. The sensing element may include multiple sensing elements.

Figure 9:
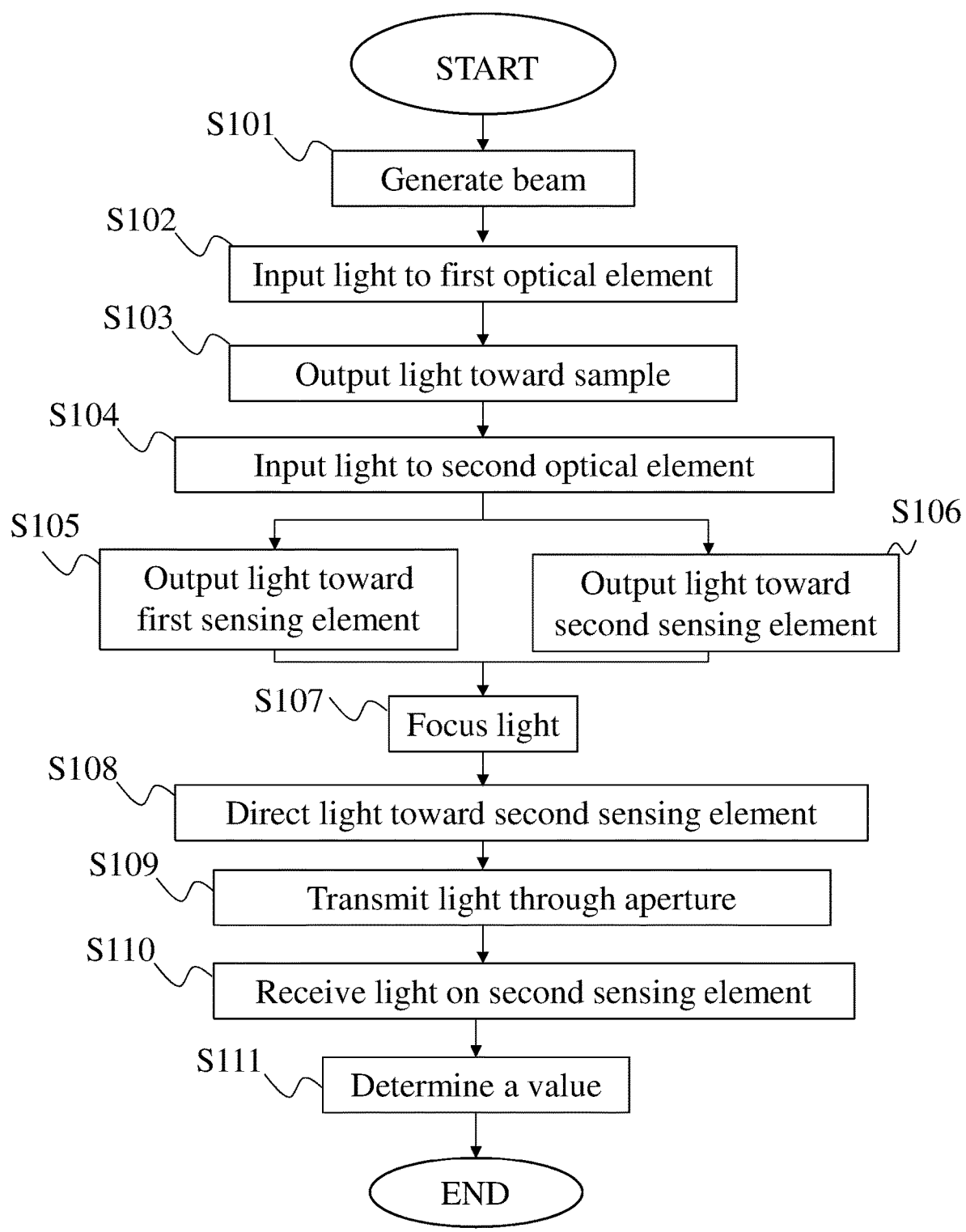
FIG. 9 is a flowchart showing an exemplary method that may be used for sensing a sample, consistent with embodiments of the present disclosure.

FIG. 9 shows an example of a method of according to embodiments of the disclosure. The method of FIG. 9 may be executed by a controller, such as controller 109. Controller 109 may issue instructions to components of a charged particle beam system, for example, or other system to accomplish certain functions. Upon starting of the routine of FIG. 9, the method may proceed to step S101. Step S101 may include forming a beam. A beam may be generated by a light source. For example, light source 272 may generate a beam, such as beam 245. Step S101 may include collimating a beam. For example, a beam may be caused to pass through collimator 274 to form the beam.

The method of FIG. 9 may also include steps S102 through S111. Step S102 may include inputting light to a first optical element. For example, step S102 may include inputting light to first optical element 610 discussed above with respect to FIG. 7A or FIG. 7B. Step S103 may include outputting light toward a sample. Step S103 may include directing light from first optical element 610 toward wafer 201.

Next, light may be reflected off the sample and may be directed back toward the first optical element. Step S104 may include inputting light to a second optical element. Step S104 may include outputting light from first optical element 610 and inputting light into second optical element 620. Next, steps S105 and S106 may occur together. Step S105 may include outputting light toward a first sensing element. Step S106 may include outputting light toward a second sensing element. For example, light input to second optical element 620 may be output toward first sensing element 640 along a first beam path and light may be output toward second sensing element 670 along a second beam path. Light may be split among the first and second beam paths.

In step S107, light may be focused. Step S107 may include focusing light along the first beam path or the second beam path. For example, light output from second sensing element 620 may pass through first lens 630. Additionally, light output from second sensing element 620 may pass through second lens 635. Light passing through first lens 630 may be focused on first sensing element 640. Light passing through second lens 635 may be focused on a focal plane where aperture 660 is arranged. In step S108, light may be directed toward second sensing element 670. Step S108 may include changing a propagation direction of light output from second optical element 620 or from second lens 635. Step S108 may include reflecting light off third optical element 650. Step S109 may include transmitting light through an opening. The opening may be a pinhole. Step S109 may include transmitting light through aperture 660. Step S110 may include receiving light on the second sensing element. Step S110 may include having light incident on second sensing element 670 generate an output.

Step S111 may include determining a value. Step S111 may include determining a parameter of a sample. A determination of step S111 may be based on output of the first sensing element or the second sensing element. For example, a determination of step S111 may include determining a degree of tilt of wafer 201 based on output of first sensing element 640 and second sensing element 670. The determination may be based on a relationship. The determination may include calculating a value using an algorithm. The algorithm may reflect a relationship between output of the first sensing element and output of the second sensing element. In some embodiments, the algorithm may reflect a relationship between properties of components of a sensing system. For example, the algorithm may reflect a relationship between properties of first sensing element 610 and second sensing element 620. Such properties may include transmittance and reflectance.

In some embodiments, a method of detecting a tilt in a sample may be provided. The sample may be a wafer. The method may include directing a laser beam at the sample to result in a reflected beam. The method may further include passing the reflected beam through an optical element to generate a first beam and a second beam. The method may further include detecting a first property of the first beam, and detecting a second property of a second beam. The first property may be a brightness of the beam, and the first property may be detected by a photodiode. The second property may be a brightness of a portion of the second beam that may be detected by a photodiode. There may be a first photodiode detecting the first beam and a second photodiode detecting the second beam. The second property of the second beam may be detected after the portion of the second beam passes through a component. The component may include an aperture. The method may further include determining a tilt of the sample based on the first property and the second property.

Figure 10:
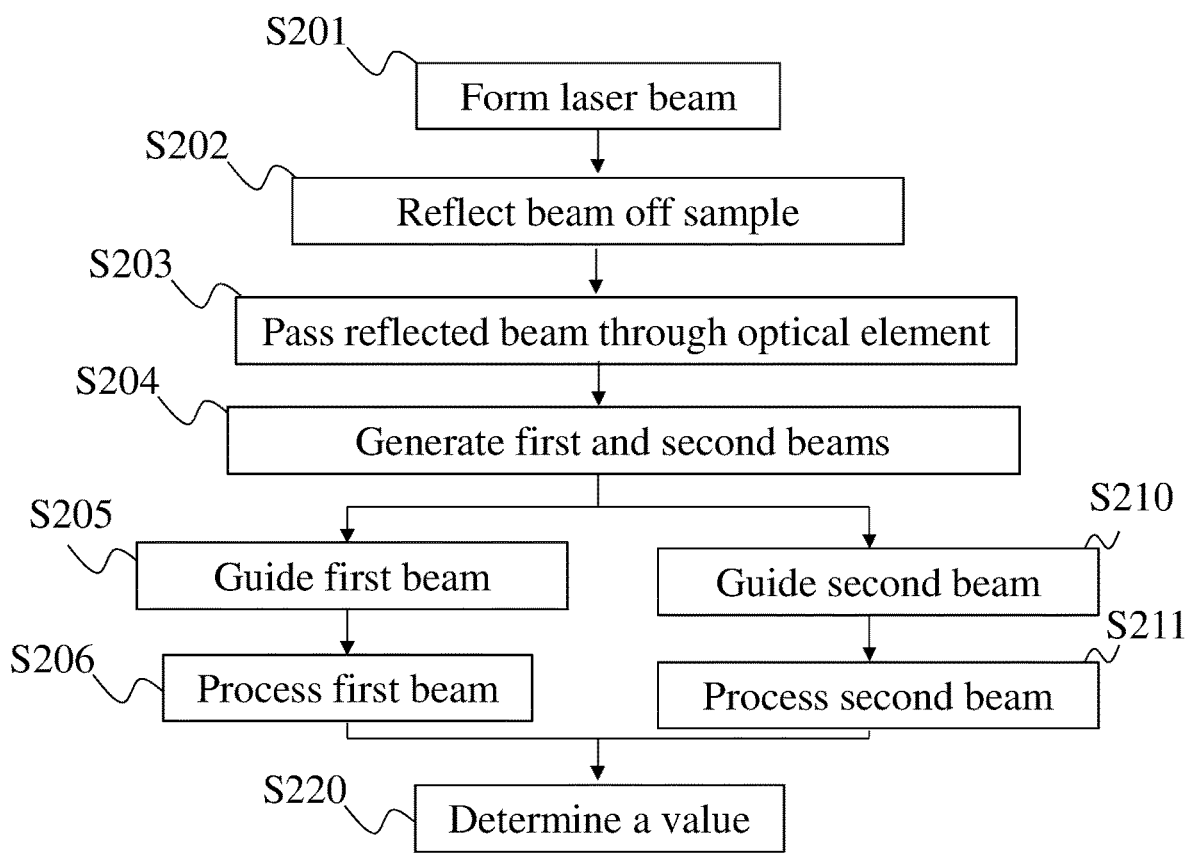
FIG. 10 is a flowchart showing an exemplary method that may be used for determining tilt of a sample, consistent with embodiments of the present disclosure.

FIG. 10 shows an example of a method of according to embodiments of the disclosure. The method of FIG. 10 may be executed by a controller, such as controller 109. The method of FIG. 10, may begin with step S201. Step S201 may include forming a laser beam. The laser beam may be generated by a source, such as a photodiode. The source may include light source 272. Step S201 may include collimating a beam. The laser beam may be directed toward a sample, such as wafer 201. Step S201 may include passing the laser beam through other optical elements. Step S201 may include passing the laser beam through a beam splitter.

Next, in step S202, the laser beam may impinge on the sample and may reflect off the sample. The emission of the reflected beam may depend on the tilt of the sample. For example, an angle of the reflected beam may depend on the degree of tilt of the sample. The reflected beam may be guided toward an optical element, such as a beam splitter. The reflected beam may pass through the beam splitter and may be directed toward other optical elements.

In step S203, at least a portion of light from the reflected beam may be directed toward another optical element. Step S203 may include outputting a beam from a beam splitter toward another beam splitter.

In step S204, a plurality of beams may be generated that may be used for sensing. Step S204 may include generating a first beam and a second beam. The first and second beams may be generated by passing a beam through a beam splitter. The first beam may be directed in one direction so as to reach a first sensing element and the second beam may be directed in another direction so as to reach a second sensing element.

In step S205, the first beam may be guided toward the first sensing element. The first beam may be processed, as in step S206. For example, the first beam may pass through a collective lens and may then impinge on the first sensing element, thereby generating a signal in the first sensing element. A property of the first beam may be determined. For example, the brightness of a beam spot formed on the first sensing element by the first beam may be determined.

Meanwhile, in step S210, the second beam may be guided toward the second sensing element. The second sensing element may be processed, as in step S211. Step S211 may include passing the second beam through another optical element. The optical element may be configured to change a property of the beam passing through it depending on the tilt of the sample. The optical element may include an aperture. The second beam may impinge on the second sensing element, thereby generating a signal in the second sensing element. A property of the second beam may be determined. For example, the brightness of a beam spot formed on the second sensing element by the second beam may be determined.

In step S220, a value may be determined based on output from the first sensing element and the second sensing element. The value may include the tilt of the sample. The value may be an angle with respect to a reference plane or a reference line.

The method of FIG. 10 may include canceling an influence of ambient light. The method may include using modulation.

The method may include canceling an influence of power source variation. The method may include changing a property of the second beam that may be based on the tilt of the sample and not based on power source variation, or ambient light, for example.

The embodiments may further be described using the following clauses:

1. An apparatus comprising:
   a light source configured to irradiate a sample;
   a first optical element configured to supply light from the light source in a first direction to the sample and to supply light input to the first optical element in a second direction to another component in a third direction;
   a second optical element configured to supply light in a fourth direction to a first sensing element and to supply light to a third optical element in a fifth direction;
   the third optical element, wherein the third optical element is configured to supply light to a second sensing element;
   a lens configured to focus light from the light source, wherein the lens is arranged between the second optical element and an aperture; and
   the aperture, wherein the aperture is arranged between the third optical element and the second sensing element, and the aperture is arranged at a focal plane of the lens.

2. The apparatus of clause 1, further comprising:
   a collimator arranged between the light source and the first optical element.

3. The apparatus of clause 1 or clause 2, further comprising:
   a controller configured to determine a value based on a relationship between output of the first sensing element and output of the second sensing element.

4. The apparatus of any one of clauses 1 to 3, wherein the light source includes a laser diode.

5. The apparatus of any one of clauses 1 to 4, wherein the light source includes another aperture through which light is configured to pass.

6. The apparatus of any one of clauses 1 to 5, wherein the light source is configured to modulate light emitted from the light source.

7. The apparatus of clause 3, wherein the controller is configured to:
   cause the light source to module light emitted from the light source; and
   demodulate a signal from the first sensing element.

8. The apparatus of any one of clauses 1 to 7, further comprising:
   a circuit board, wherein the light source, the first sensing element, and the second sensing element are arranged on the circuit board.

9. The apparatus of any one of clauses 1 to 8, wherein the aperture includes a pinhole.

10. An apparatus comprising:
    a first beam splitter configured to transmit light toward a sample, and to reflect light toward a second beam splitter;
    the second beam splitter, wherein the second beam splitter is configured to transmit light along a first beam path and a second beam path; and
    an aperture arranged on the second beam path.

11. The apparatus of clause 10, further comprising:
    a light source configured to input light into the first beam splitter.

12. The apparatus of clause 10 or clause 11, further comprising:
    a mirror arranged on the second beam path and configured to reflect light toward the aperture.

13. The apparatus of any one of clauses 10 to 12, further comprising:
    a collimator arranged between the light source and the first beam splitter.

14. The apparatus of any one of clauses 10 to 13, further comprising:
    a first lens configured to focus a beam along the first beam path.

15. The apparatus of any one of clauses 10 to 14, further comprising:
a second lens configured to focus a beam along the second beam path, wherein the aperture is arranged at a focal plane of the second lens.

16. A method of sensing a beam of light, comprising:
inputting light into a first optical element;
inputting light from the first optical element into a second optical element;
directing light from the second optical element along a first beam path toward a first sensing element;
focusing light along a second beam path; and
transmitting light through an aperture.

17. The method of clause 16, further comprising:
collimating light input to the first optical element.

18. The method of clause 16 or clause 17, further comprising:
directing light from a third optical element arranged on the second beam path toward a second sensing element,
wherein focusing light along the second beam path includes focusing light to a point at a center of the aperture, wherein the aperture includes a pinhole and the aperture is between the second optical element and the second sensing element.

19. The method of clause 18, further comprising:
determining a value based on a relationship between output of the first sensing element and output of the second sensing element.

20. The method of clause 19, wherein determining the value includes calculating the value using an algorithm.

21. The apparatus of any one of clauses 1 to 9, wherein the fourth direction is parallel to the second direction, and the fifth direction is parallel to the third direction.

22. A method of determining a tilt of a sample, the method comprising:
directing a laser beam at the sample to result in a reflected beam;
passing the reflected beam through a first optical element to generate a first beam and a second beam;
determining a first property of the first beam;
determining a second property of the second beam; and
determining the tilt of the sample based on the first property and the second property.

23. The method of clause 22, wherein
the first property includes an amount of light of the first beam, and
the second property includes an amount of light of the second beam.

24. The method of clause 22, wherein
the first property includes the first property includes intensity of the first beam, and
the second property includes intensity of the second beam.

25. The method of clause 22, wherein
the first property includes brightness of a spot formed by the first beam on a first sensing element, and
the second property includes brightness of a spot formed by the second beam on a second sensing element.

26. The method of any one of clauses 22 to 25, further comprising:
passing the second beam through a second optical element, wherein the second optical element is configured to change the second property based on the tilt of the sample.

27. The method of clause 26, wherein
the second optical element includes an aperture configured to reduce an amount of light transmitted through the aperture as the tilt increases.

28. The method of any one of clauses 22 to 27, further comprising:
passing the reflected beam through a third optical element, the third optical element being arranged between the sample and the first optical element, wherein the reflected beam is directed toward the first optical element.

29. The method of any one of clauses 22 to 28, further comprising:
canceling an influence of ambient light.

30. The method of any one of clauses 22 to 29, further comprising:
canceling an influence of power source variation.

31. The method of any one of clauses 22 to 30, further comprising:
modulating the laser beam.

32. The method of clause 25, further comprising:
reducing the brightness of the spot formed by the second beam on the second sensing element as the tilt increases.

33. A non-transitory computer readable medium that stores a set of instructions that is executable by at least one processor of a computing device to perform a method for enhancing an image, the method comprising:
the method of any of clauses 16-32.

In some embodiments, a sensor, such as a tilt sensor, may communicate with a controller that controls a charged particle beam system. The controller may instruct components of the charged particle beam system to perform various functions, such as controlling a charged particle source to generate a charged particle beam and controlling a deflector to scan the charged particle beam. The controller may also perform various other functions such as adjusting a position of a sample. The controller may comprise a storage that is a storage medium such as a hard disk, random access memory (RAM), other types of computer readable memory, and the like. The storage may be used for saving scanned raw image data as original images, and post-processed images. A non-transitory computer readable medium may be provided that stores instructions for a processor of controller 109 to carry out charged particle beam detection, sampling period determination, image processing, or other functions and methods consistent with the present disclosure. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a ROM, a PROM, and EPROM, a FLASH-EPROM or any other flash memory, NVRAM, a cache, a register, any other memory chip or cartridge, and networked versions of the same.

Block diagrams in the figures may illustrate the architecture, functionality, and operation of possible implementations of systems, methods, and computer hardware/software products according to various exemplary embodiments of the present disclosure. In this regard, each block in a schematic diagram may represent certain arithmetical or logical operation processing that may be implemented using hardware such as an electronic circuit. Blocks may also represent a module, segment, or portion of code that comprises one or more executable instructions for implementing the specified logical functions. It should be understood that in some alternative implementations, functions indicated in a block may occur out of the order noted in the figures. For example, two blocks shown in succession may be executed or implemented substantially concurrently, or two blocks may sometimes be executed in reverse order, depending upon the functionality involved. Some blocks may also be omitted. It should also be understood that each block of the block diagrams, and combination of the blocks, may be implemented by special purpose hardware-based systems that perform the specified functions or acts, or by combinations of special purpose hardware and computer instructions.

It will be appreciated that the present invention is not limited to the exact construction that has been described above and illustrated in the accompanying drawings, and that various modifications and changes can be made without departing from the scope thereof.

The invention claimed is:

1. An apparatus comprising:
   a light source configured to irradiate a sample;
   a first optical element configured to supply light from the light source in a first direction to the sample and to supply light input to the first optical element in a second direction to a second optical element in a third direction, wherein
   the second optical element is configured to supply light in a fourth direction to a first sensing element and to supply light to a third optical element in a fifth direction;
   the third optical element, wherein the third optical element is configured to supply light to a second sensing element that is coplanar with the first sensing element in a plane parallel to the sample;
   a lens configured to focus light from the light source, wherein the lens is arranged between the second optical element and an aperture; and
   the aperture, wherein the aperture is arranged between the third optical element and the second sensing element, and the aperture is arranged at a focal plane of the lens.

2. The apparatus of claim 1, further comprising:
   a collimator arranged between the light source and the first optical element.

3. The apparatus of claim 1, further comprising:
   a controller configured to determine a value based on a relationship between output of the first sensing element and output of the second sensing element.

4. The apparatus of claim 1, wherein the light source includes a laser diode.

5. The apparatus of claim 1, wherein the light source includes another aperture through which light is configured to pass.

6. The apparatus of claim 1, wherein the light source is configured to modulate light emitted from the light source.

7. The apparatus of claim 3, wherein the controller is configured to:
   cause the light source to modulate light emitted from the light source; and
   demodulate a signal from the first sensing element.

8. The apparatus of claim 1, further comprising:
   a circuit board, wherein the light source, the first sensing element, and the second sensing element are arranged on the circuit board.

9. The apparatus of claim 1, wherein the aperture includes a pinhole.

10. A method of sensing a beam of light, comprising:
    inputting light into a first optical element;
    inputting light from the first optical element into a second optical element;
    directing light from the second optical element along a first beam path toward a first sensing element that is coplanar with a second sensing element in a plane parallel to a sample;
    focusing light along a second beam path; and
    transmitting light through an aperture.

11. The method of claim 10, further comprising:
    collimating light input to the first optical element.

12. The method of claim 10, further comprising:
    directing light from a third optical element arranged on the second beam path toward the second sensing element,
    wherein focusing light along the second beam path includes focusing light to a point at a center of the aperture, wherein the aperture includes a pinhole and the aperture is between the second optical element and the second sensing element.

13. The method of claim 12, further comprising:
    determining a value based on a relationship between output of the first sensing element and output of the second sensing element.

14. The method of claim 13, wherein determining the value includes calculating the value using an algorithm.

15. A non-transitory computer readable medium that stores a set of instructions that is executable by at least one processor of a computing device to perform a method for enhancing an image, the method comprising:
    inputting light into a first optical element;
    inputting light from the first optical element into a second optical element;
    directing light from the second optical element along a first beam path toward a first sensing element that is coplanar with a second sensing element in a plane parallel to a sample;
    focusing light along a second beam path; and
    transmitting light through an aperture.

* * * * *